United States Patent
Na et al.

(10) Patent No.: US 12,500,156 B2
(45) Date of Patent: Dec. 16, 2025

(54) CIRCUIT BOARD

(71) Applicant: LG INNOTEK CO., LTD., Seoul (KR)

(72) Inventors: Se Woong Na, Seoul (KR); Sang Il Kim, Seoul (KR); Jung Eun Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 67 days.

(21) Appl. No.: 18/268,186

(22) PCT Filed: Dec. 17, 2021

(86) PCT No.: PCT/KR2021/019307
§ 371 (c)(1),
(2) Date: Jun. 16, 2023

(87) PCT Pub. No.: WO2022/131861
PCT Pub. Date: Jun. 23, 2022

(65) Prior Publication Data
US 2024/0063104 A1    Feb. 22, 2024

(30) Foreign Application Priority Data

Dec. 17, 2020   (KR) .......................... 10-2020-0177287
Dec. 17, 2020   (KR) .......................... 10-2020-0177383

(51) Int. Cl.
*H01L 23/49* (2006.01)
*H01L 21/48* (2006.01)
(Continued)

(52) U.S. Cl.
CPC .... *H01L 23/49822* (2013.01); *H01L 21/4857* (2013.01); *H05K 1/0296* (2013.01); *H05K 3/28* (2013.01); *H05K 3/381* (2013.01)

(58) Field of Classification Search
CPC .. H01L 23/49822; H05K 1/0296; H05K 3/28; H05K 2203/0307; H05K 2203/0588
(Continued)

(56) References Cited

U.S. PATENT DOCUMENTS 11,528,801 B2    12/2022 Kim et al.
2014/0054073 A1   2/2014 Lee et al.
(Continued)

FOREIGN PATENT DOCUMENTS

JP     2015-3982 A       1/2015
JP     2015-222771 A    12/2015
(Continued)

*Primary Examiner* — Timothy J Thompson
*Assistant Examiner* — Sidi M Maiga
(74) *Attorney, Agent, or Firm* — Birch, Stewart, Kolasch & Birch, LLP

(57) ABSTRACT

A circuit board according to an embodiment includes an insulating layer; a circuit pattern disposed on the insulating layer; and a protective layer disposed on the insulating layer and the circuit pattern, and including first and second regions having different heights; wherein the circuit pattern includes: a first-first circuit pattern corresponding to the first region of the protective layer; and a first-second circuit pattern corresponding to the second region of the protective layer, wherein a height of the first region of the protective layer is lower than a height of the first-first circuit pattern, wherein a height of the second region of the protective layer is higher than a height of the first-second circuit pattern, wherein a surface of the first-first circuit pattern includes: a first portion in contact with the first region of the protective layer, and a second portion excluding the first portion, and wherein a surface roughness Ra of the first portion is different from a surface roughness Ra of the second portion.

13 Claims, 21 Drawing Sheets

(51) Int. Cl.
*H01L 23/498*  (2006.01)
*H05K 1/02*    (2006.01)
*H05K 3/28*    (2006.01)
*H05K 3/38*    (2006.01)

(58) Field of Classification Search
USPC ........................................................ 174/251
See application file for complete search history.

(56) References Cited

U.S. PATENT DOCUMENTS

| | | |
|---|---|---|
| 2015/0008020 A1 | 1/2015 | Kaneko et al. |
| 2015/0034366 A1 | 2/2015 | Yoshioka et al. |
| 2015/0102510 A1* | 4/2015 | Kaneda ................ H05K 3/0052 174/250 |
| 2015/0334850 A1* | 11/2015 | Hayashi .................. H05K 3/46 174/251 |
| 2016/0343654 A1 | 11/2016 | Kojima |
| 2020/0178392 A1* | 6/2020 | Hwang .................. H05K 3/421 |

FOREIGN PATENT DOCUMENTS

| | | |
|---|---|---|
| JP | 2016-219559 A | 12/2016 |
| JP | 2017-103444 A | 6/2017 |
| KR | 10-2013-0099093 A | 9/2013 |
| KR | 10-2014-0027731 | 3/2014 |
| KR | 10-2015-0004746 | 1/2015 |
| KR | 10-2016-0020407 A | 2/2016 |
| KR | 10-2016-0110159 A | 9/2016 |
| KR | 10-2017-0079574 A | 7/2017 |
| KR | 10-2113095 B1 | 5/2020 |
| TW | 202025430 A | 7/2020 |

\* cited by examiner

[FIG. 1a]
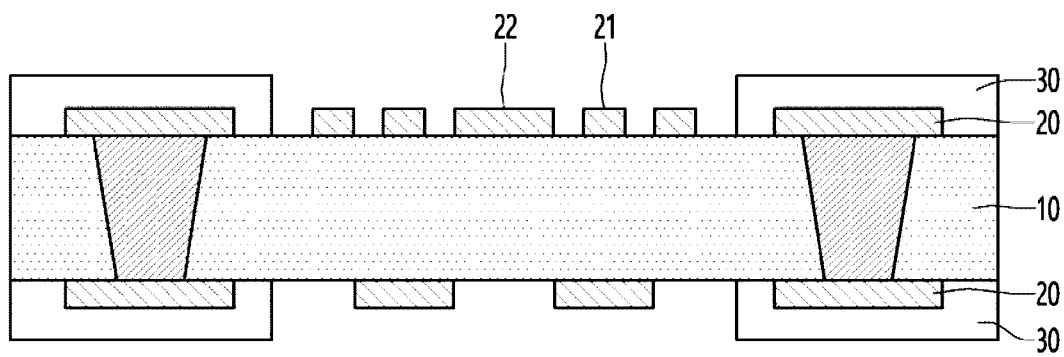
[FIG. 1b]
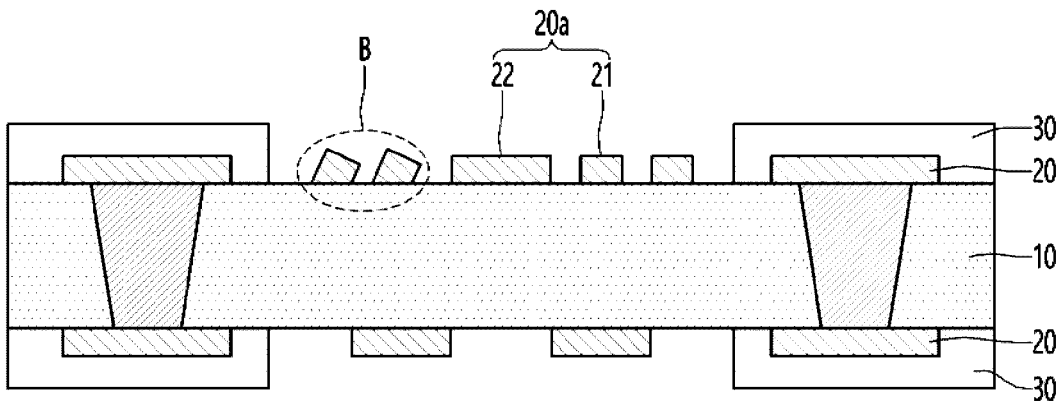

[FIG. 2]
1A
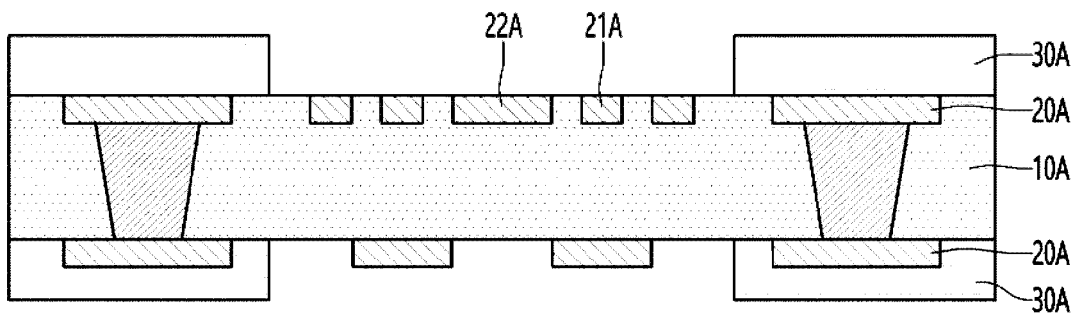

[FIG. 3]
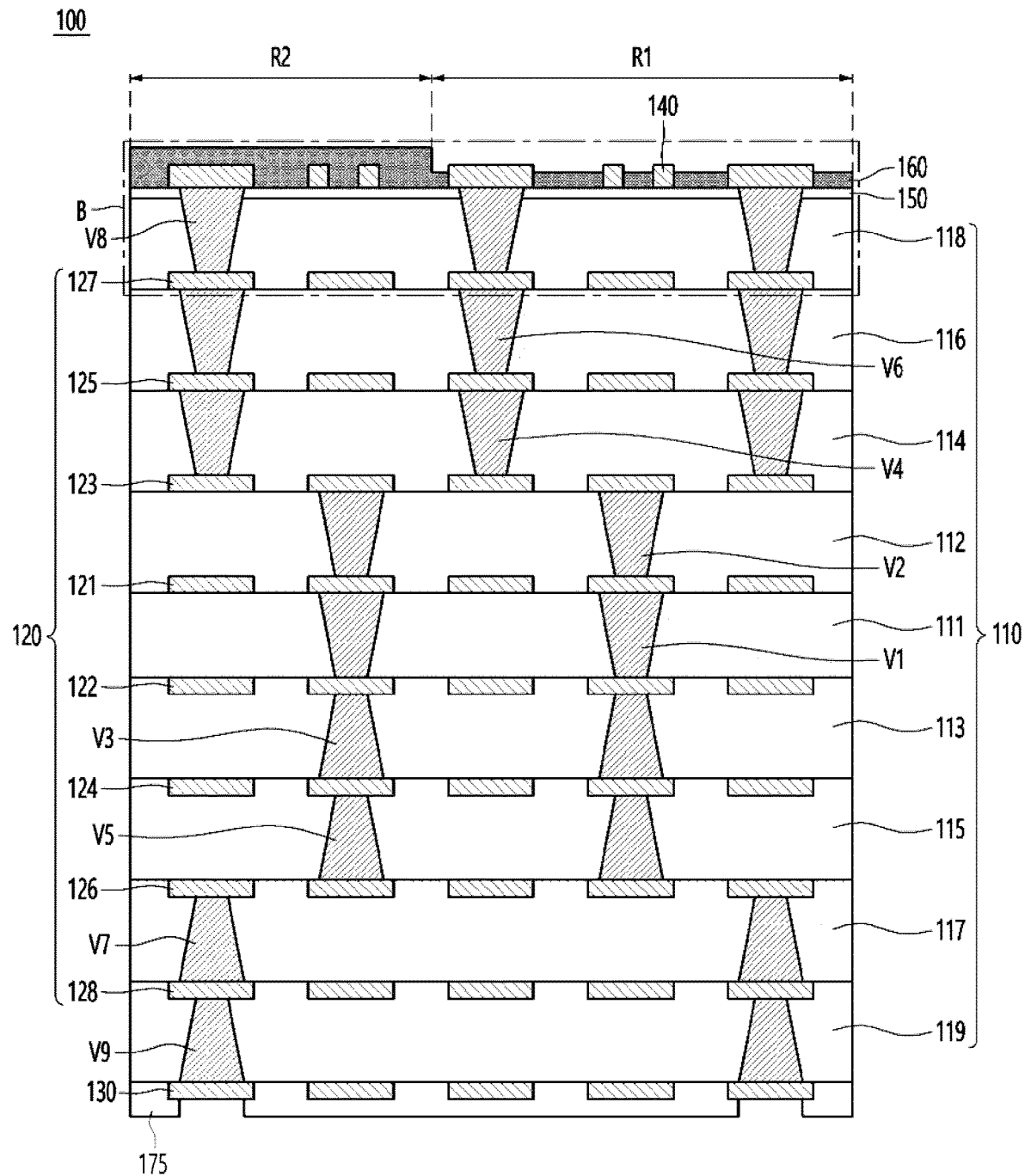

[FIG. 4a]
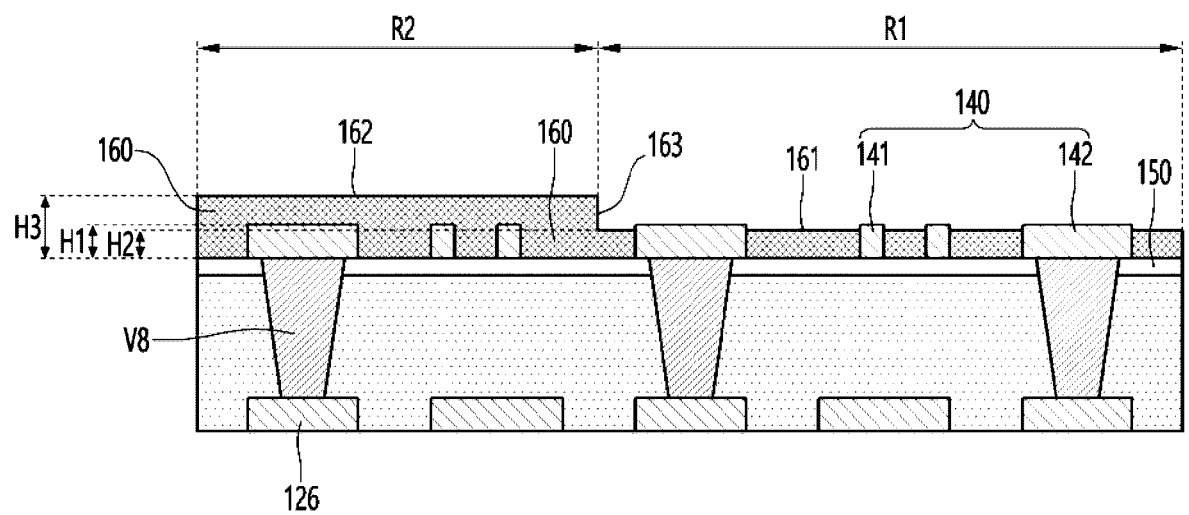
[FIG. 4b]
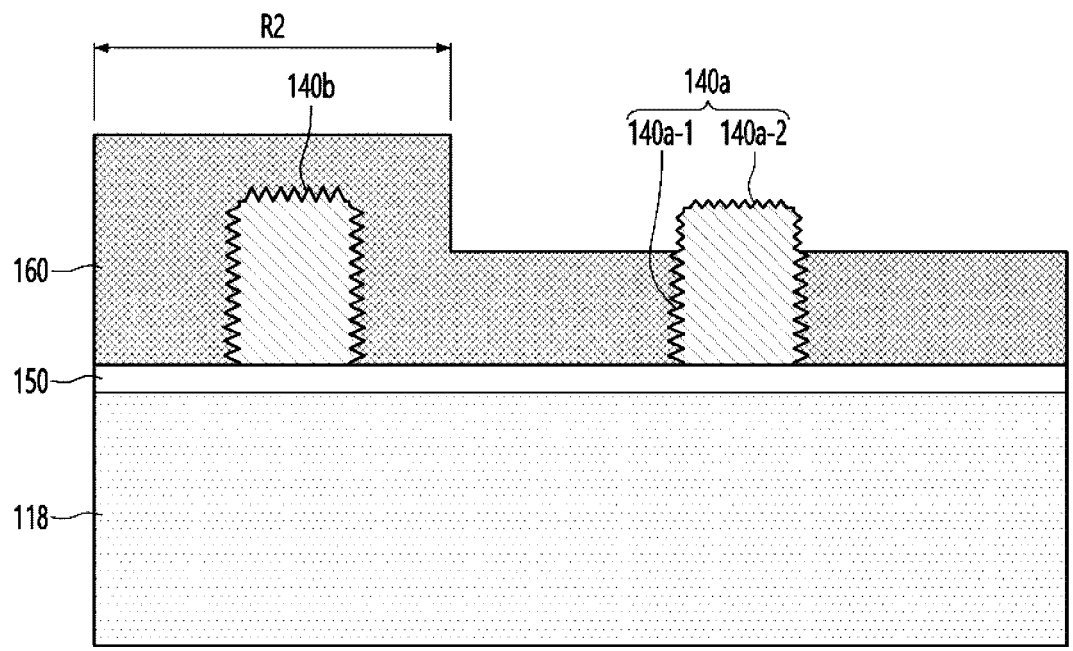

【FIG. 5a】
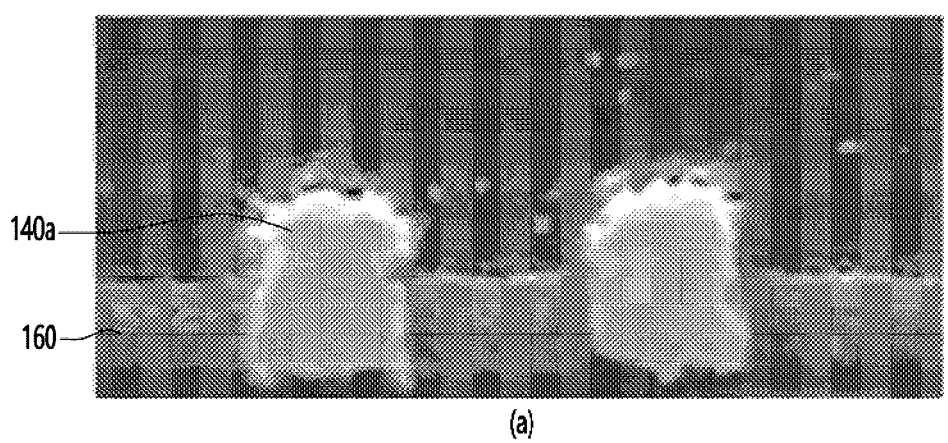
(a)
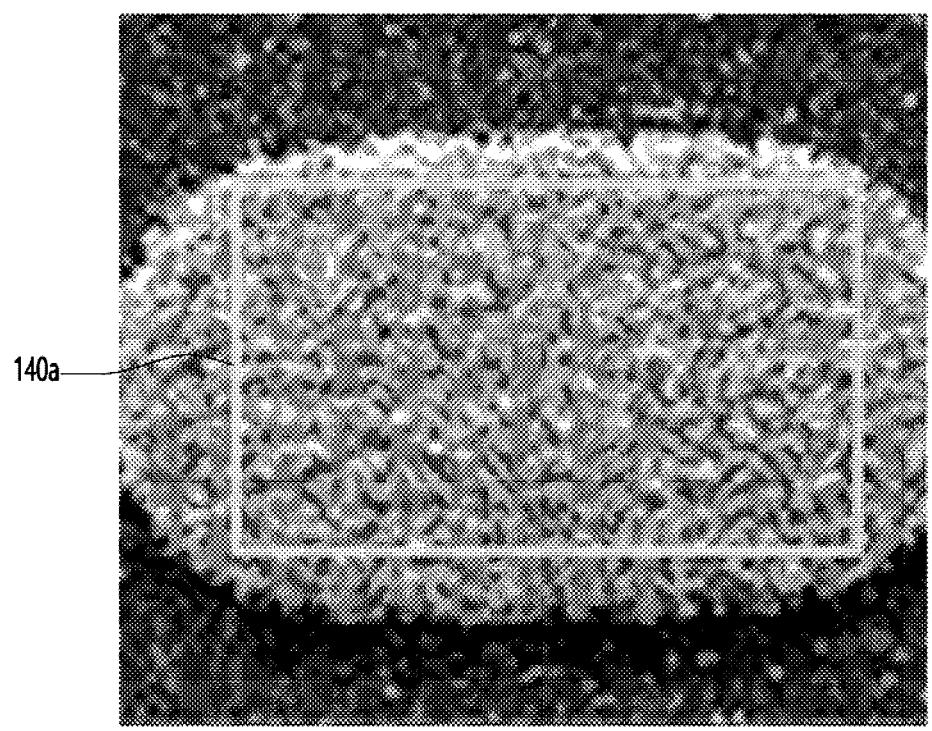
(b)

[FIG. 5b]
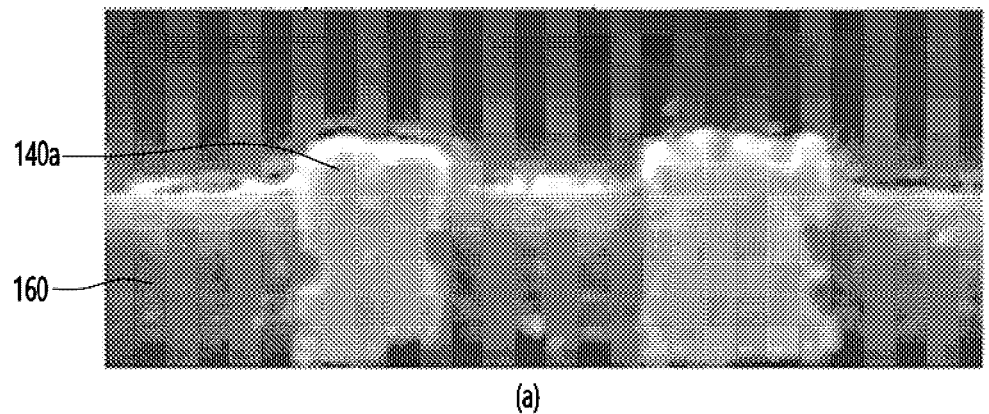
(a)
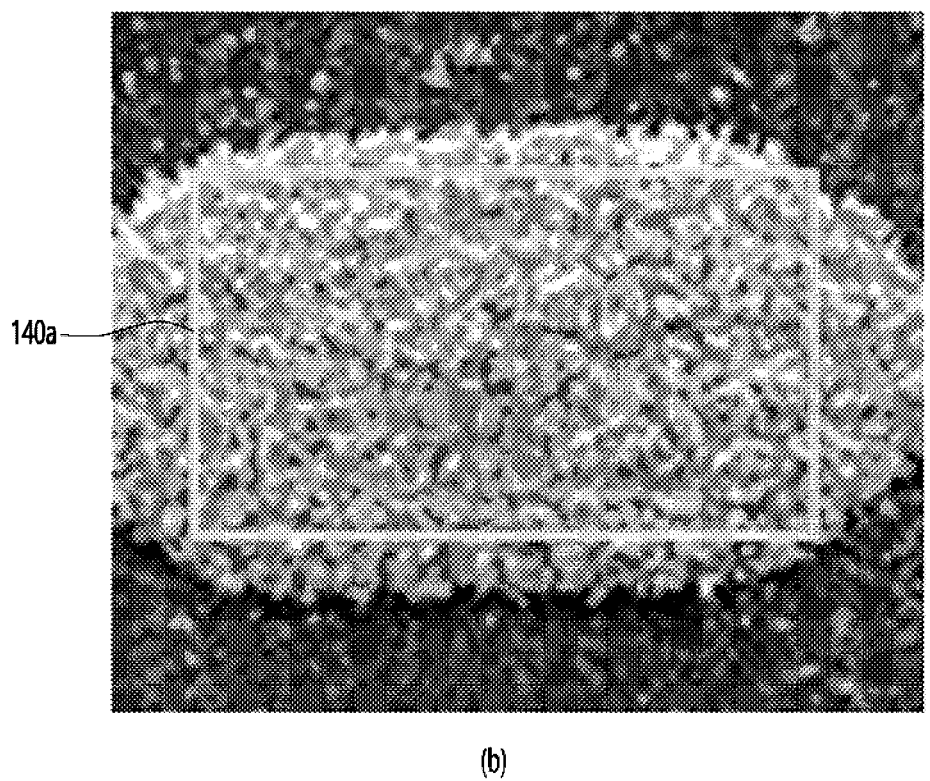
(b)

[FIG. 5c]
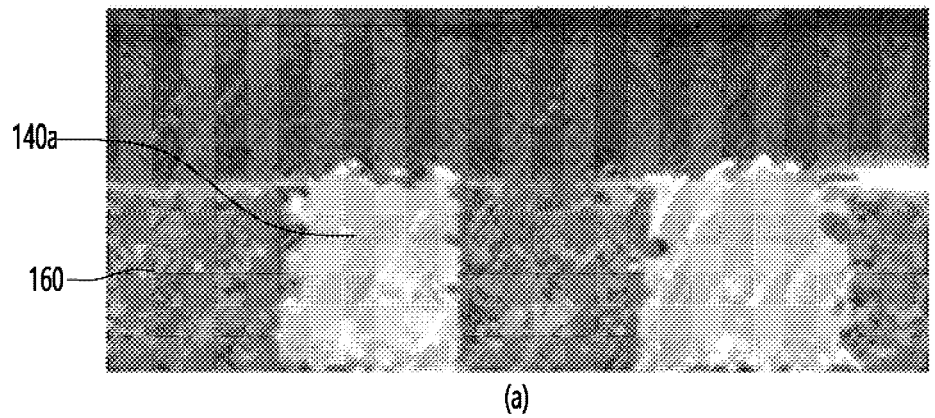
(a)
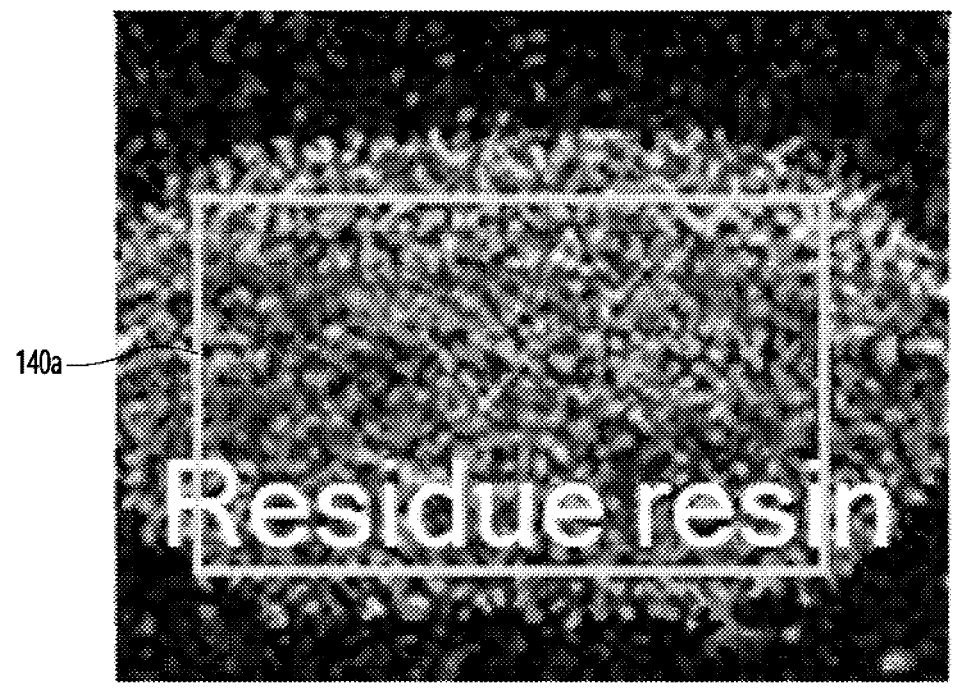
(b)

[FIG. 5d]
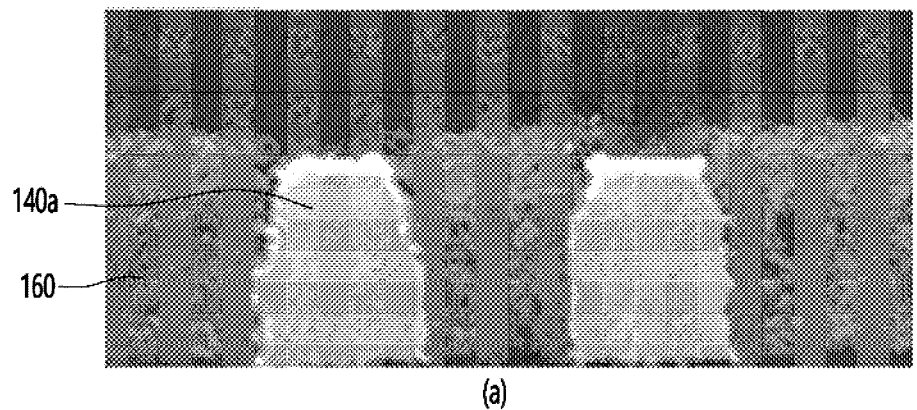
(a)
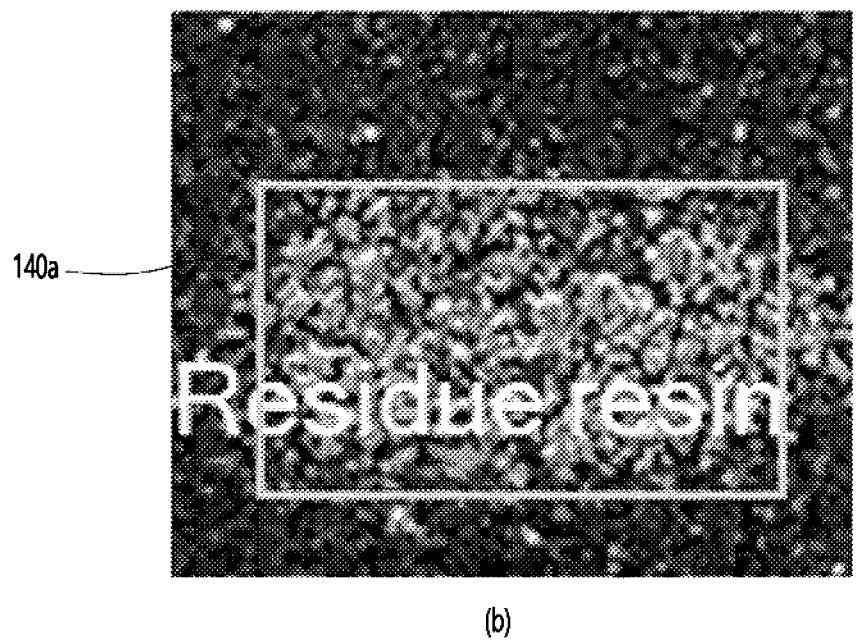
(b)

[FIG. 5e]
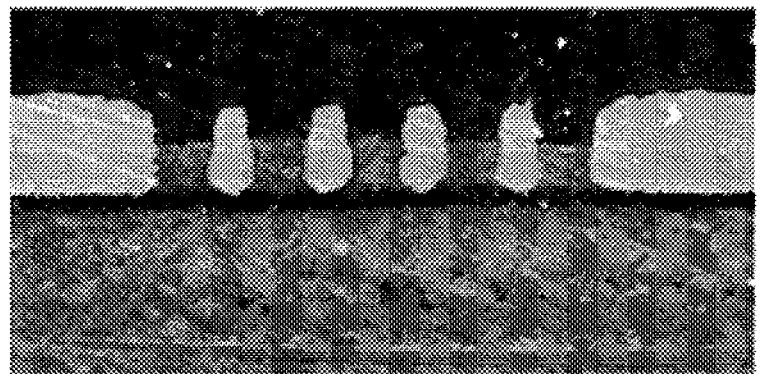
(a)
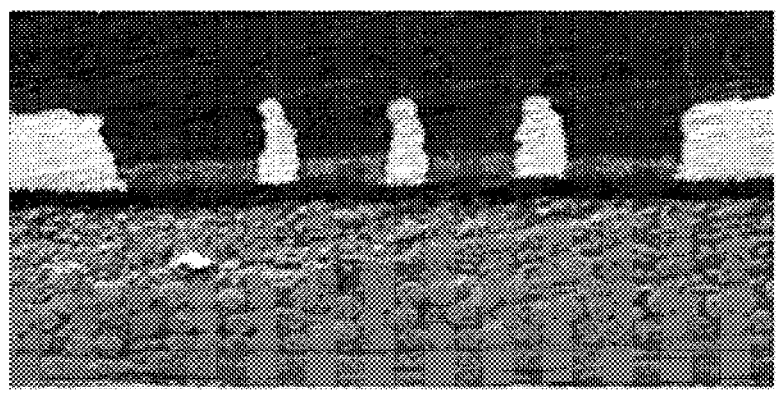
(b)
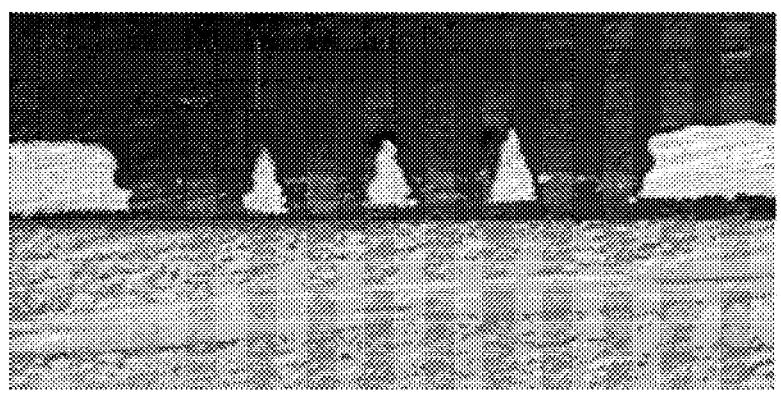
(c)

[FIG. 6]
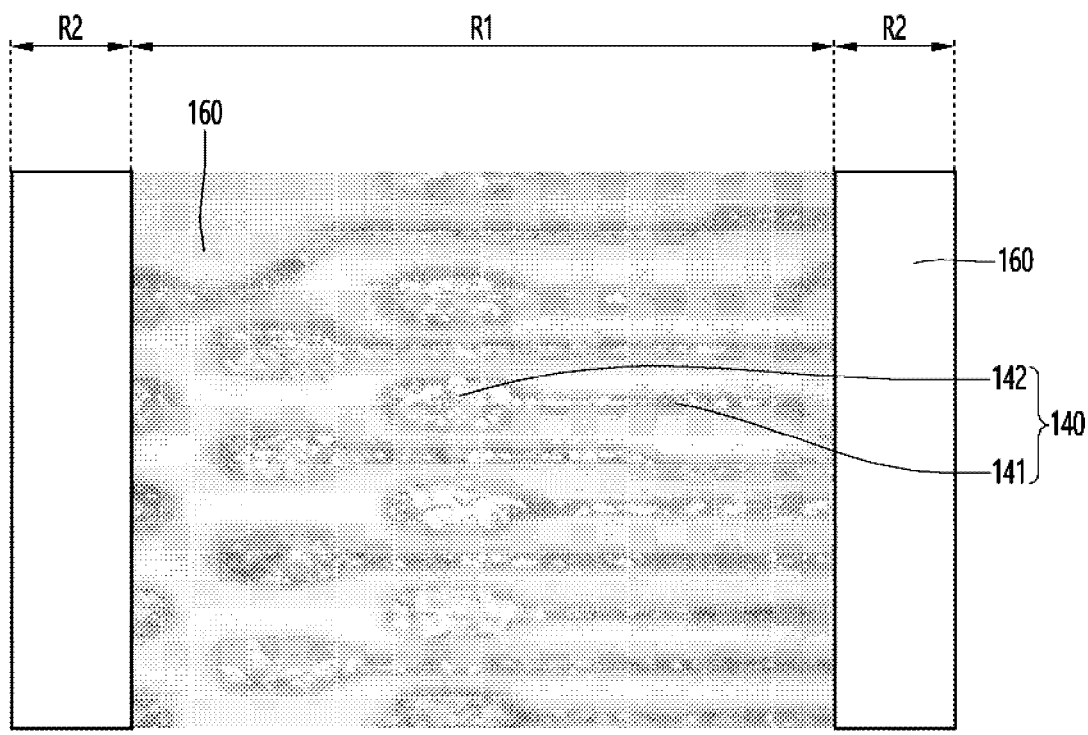
[FIG. 7]
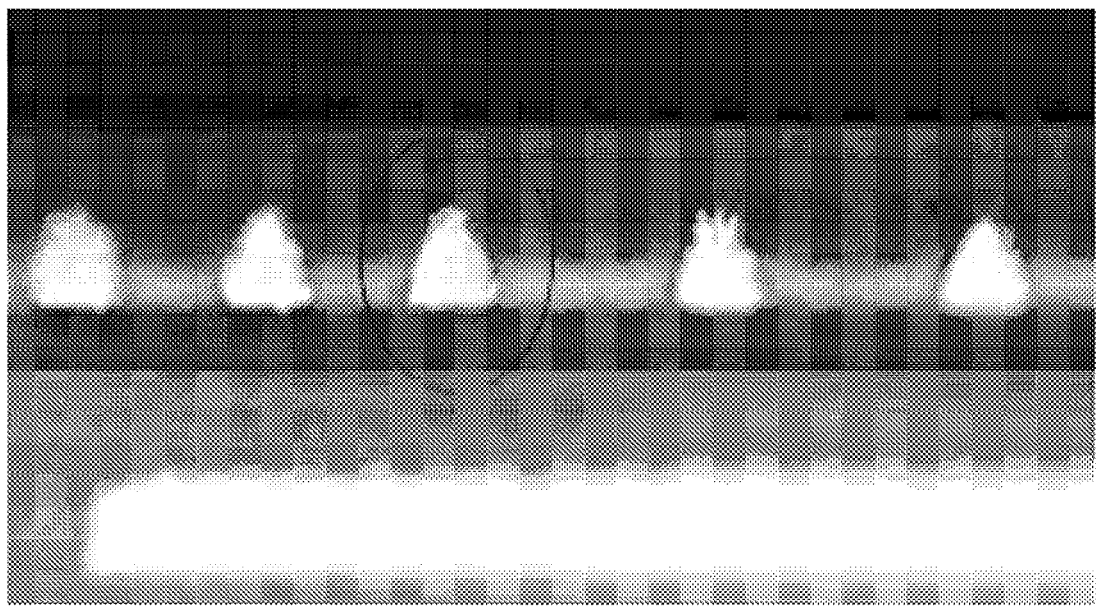

【FIG. 8】
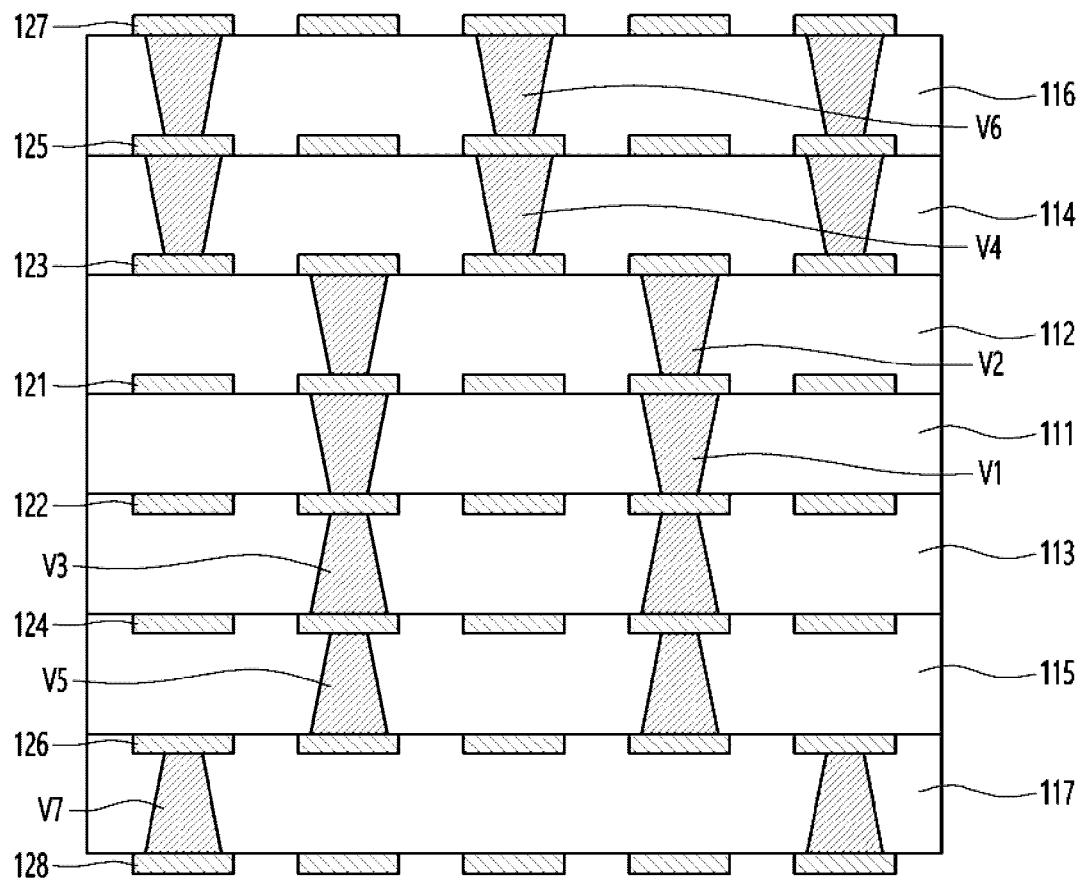

[FIG. 9]
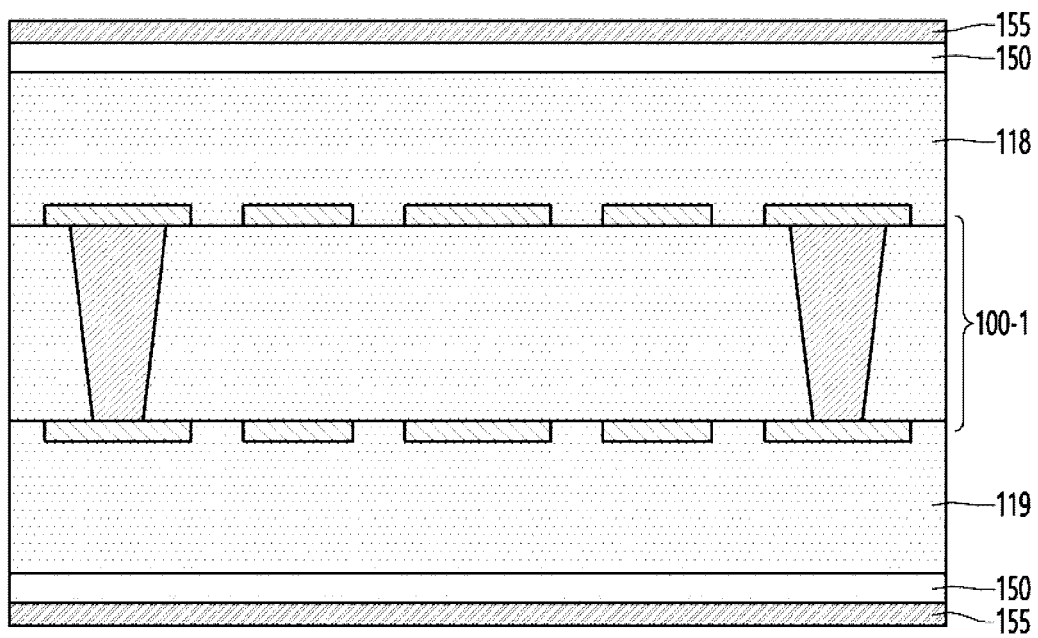

[FIG. 10]
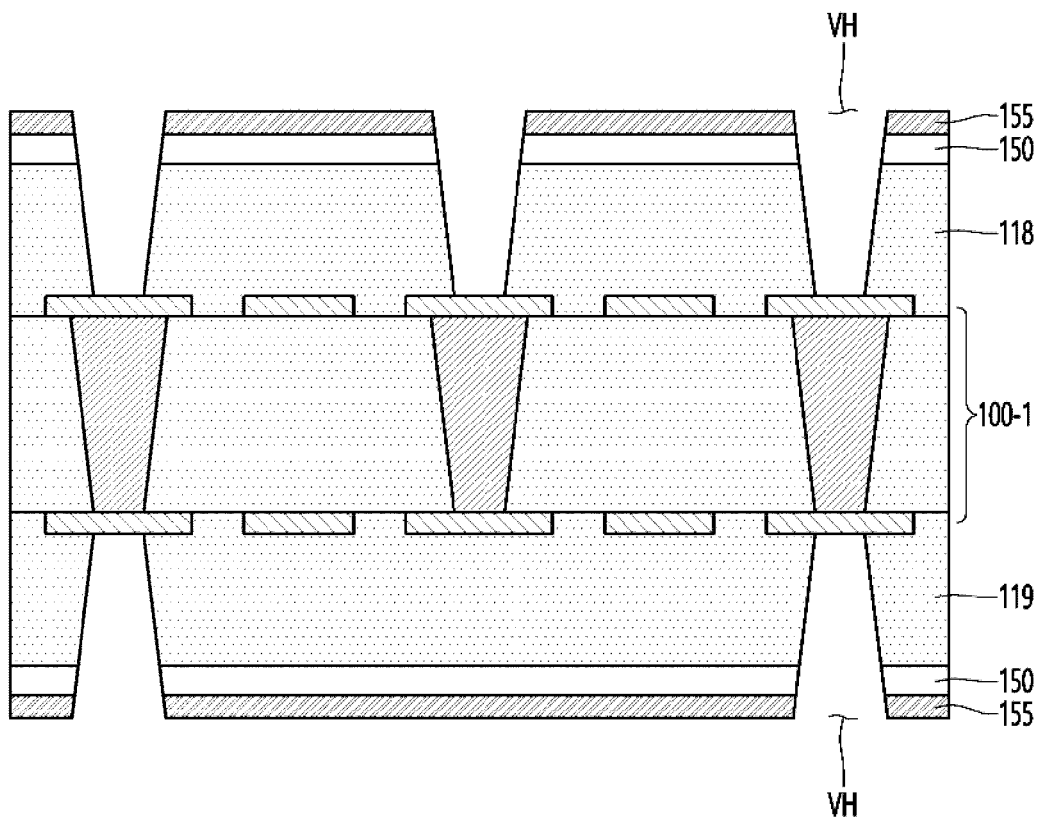

[FIG. 11]
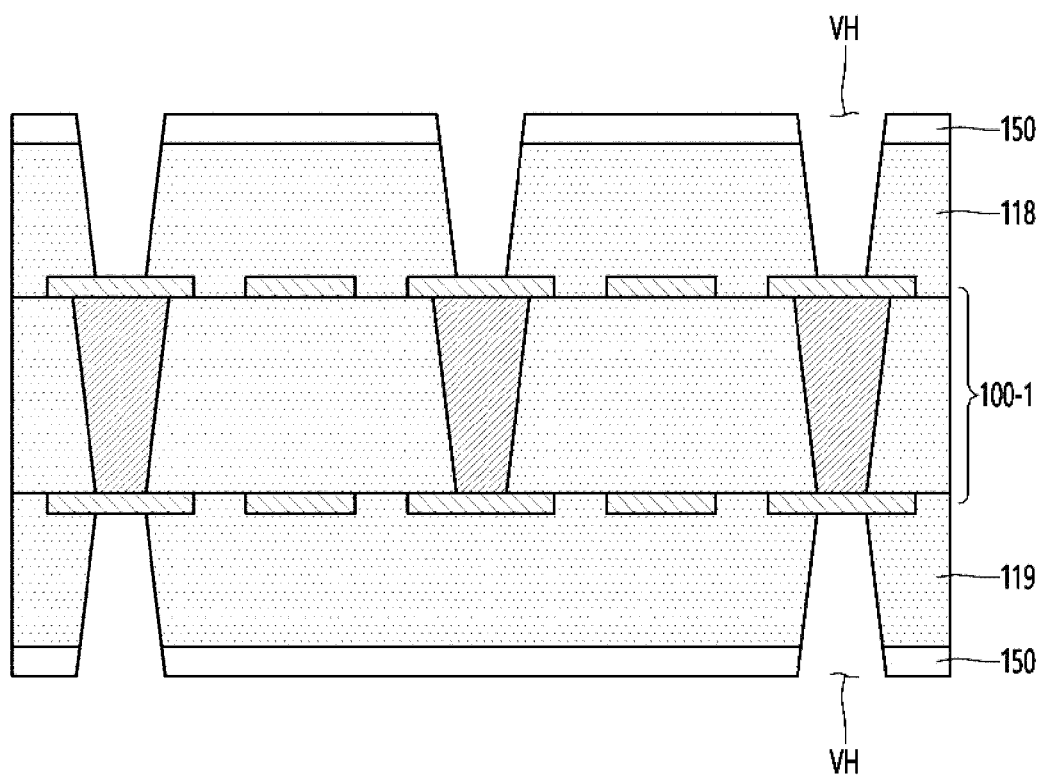

[FIG. 12]
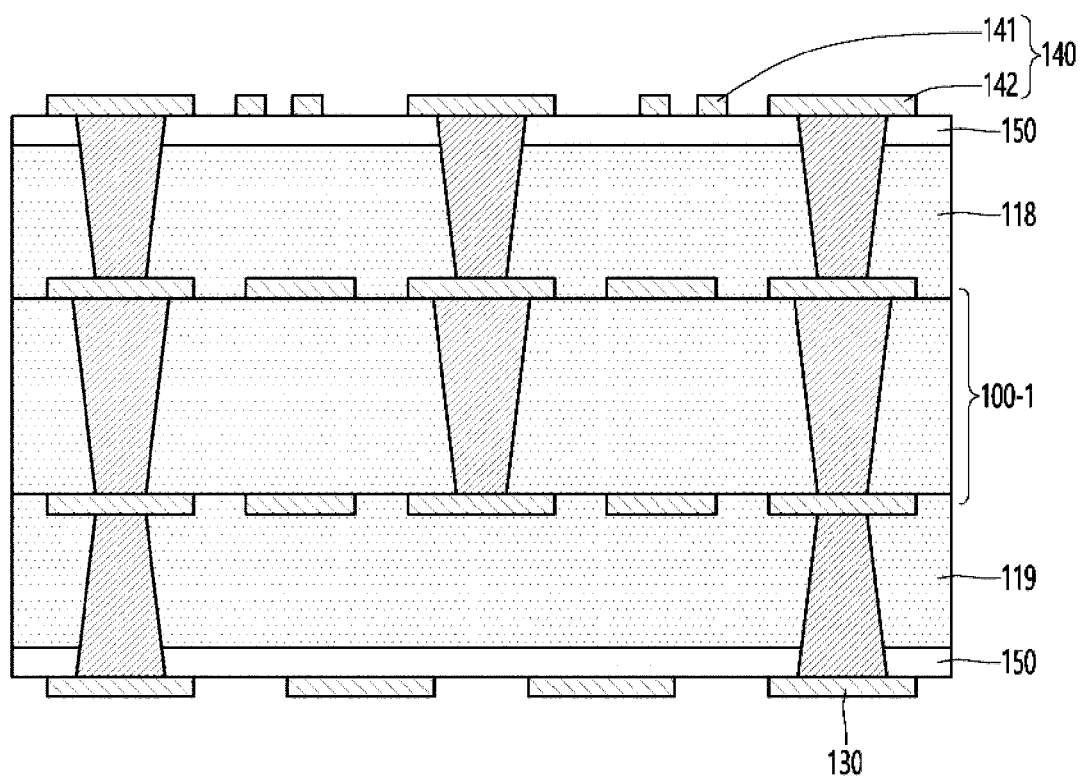

[FIG. 13]
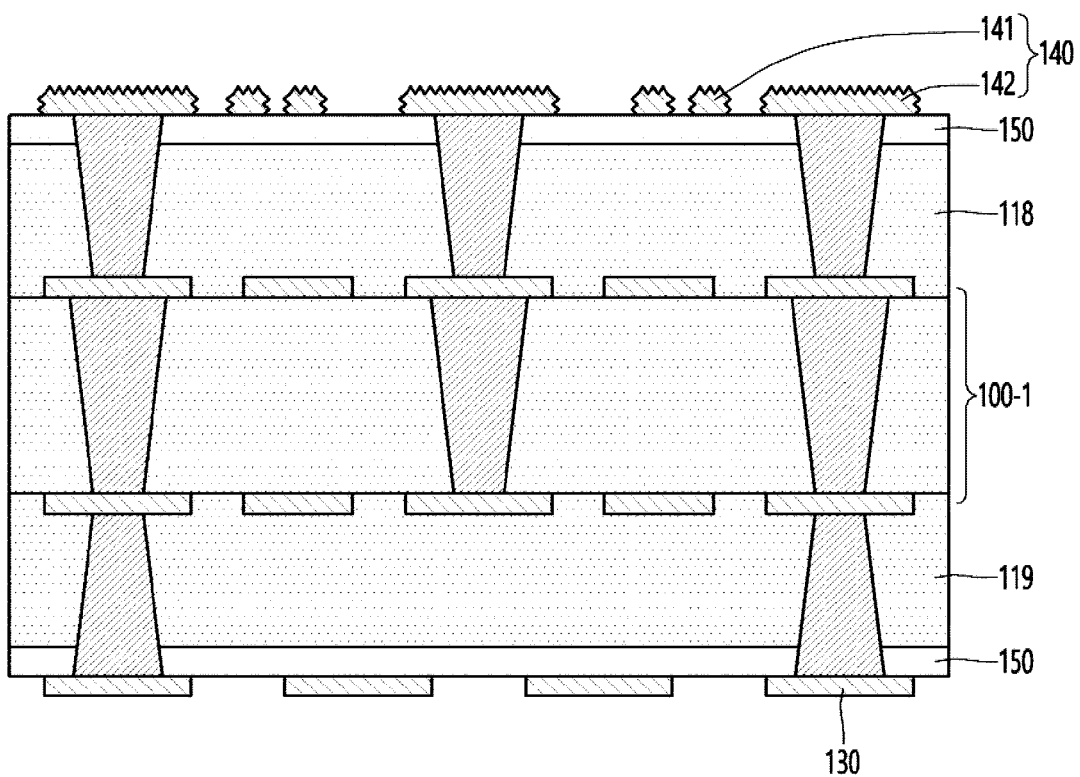

[FIG. 14]
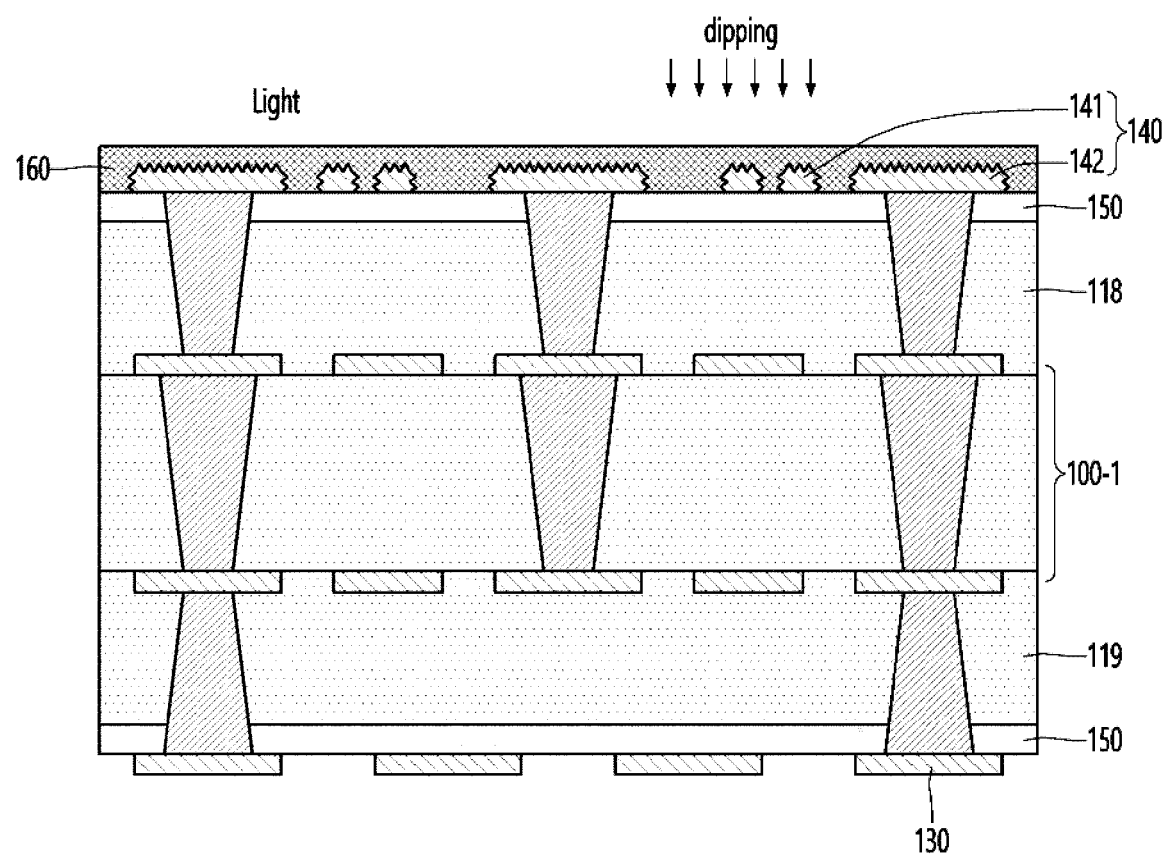

[FIG. 15]
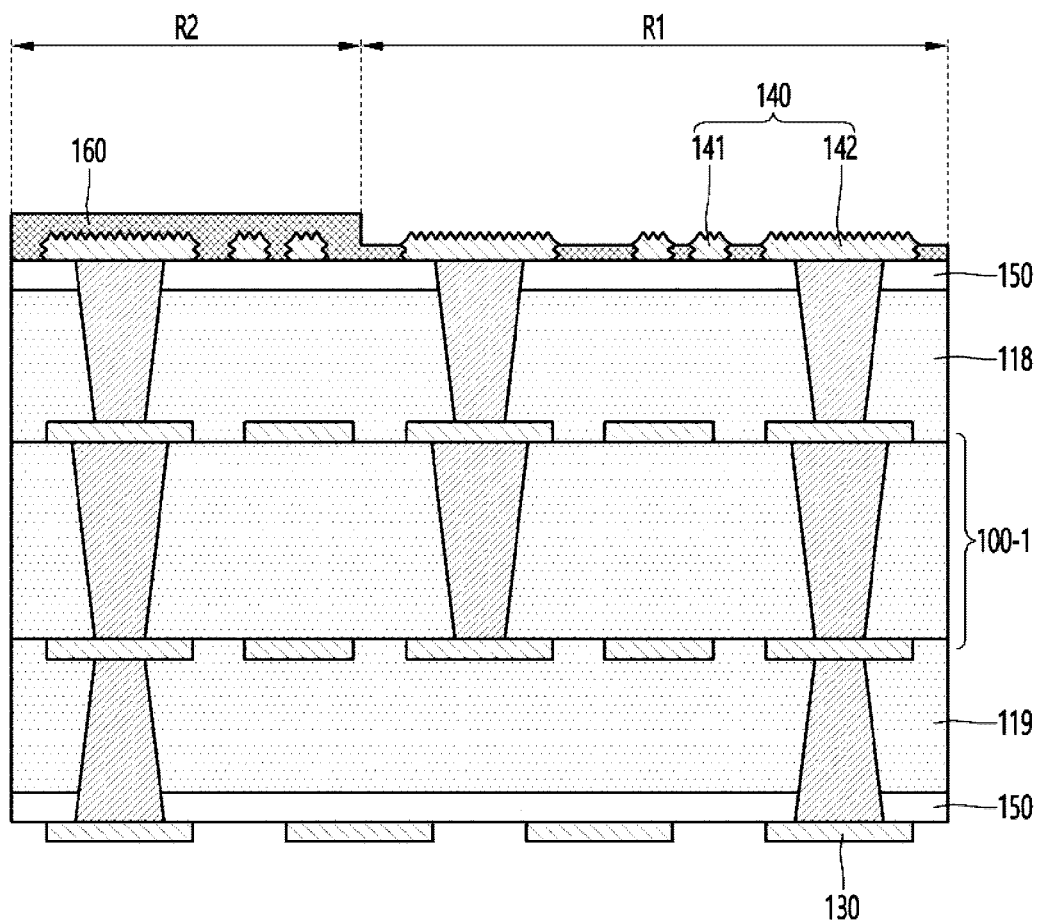

[FIG. 16]
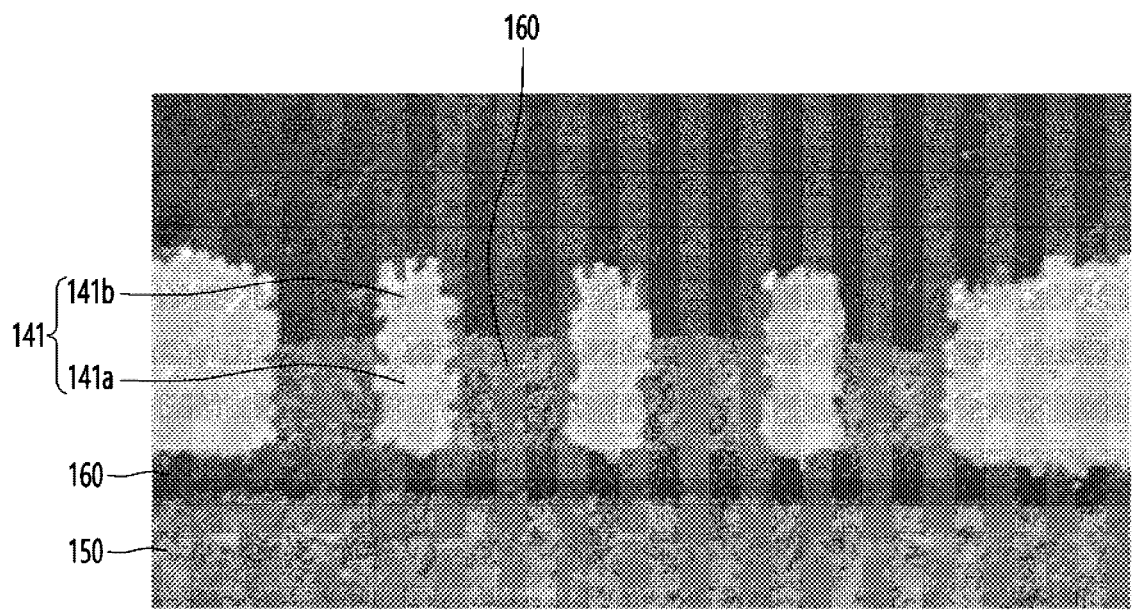

[FIG. 17]
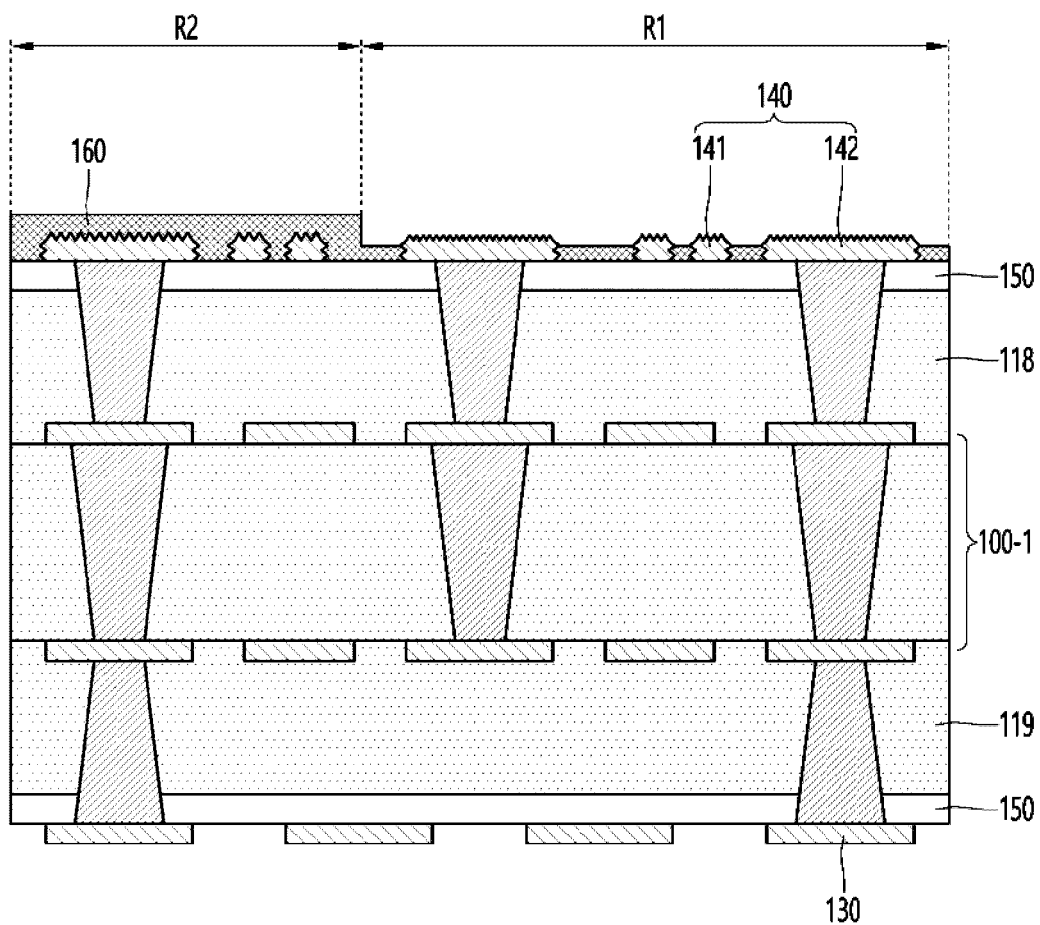

[FIG. 18]
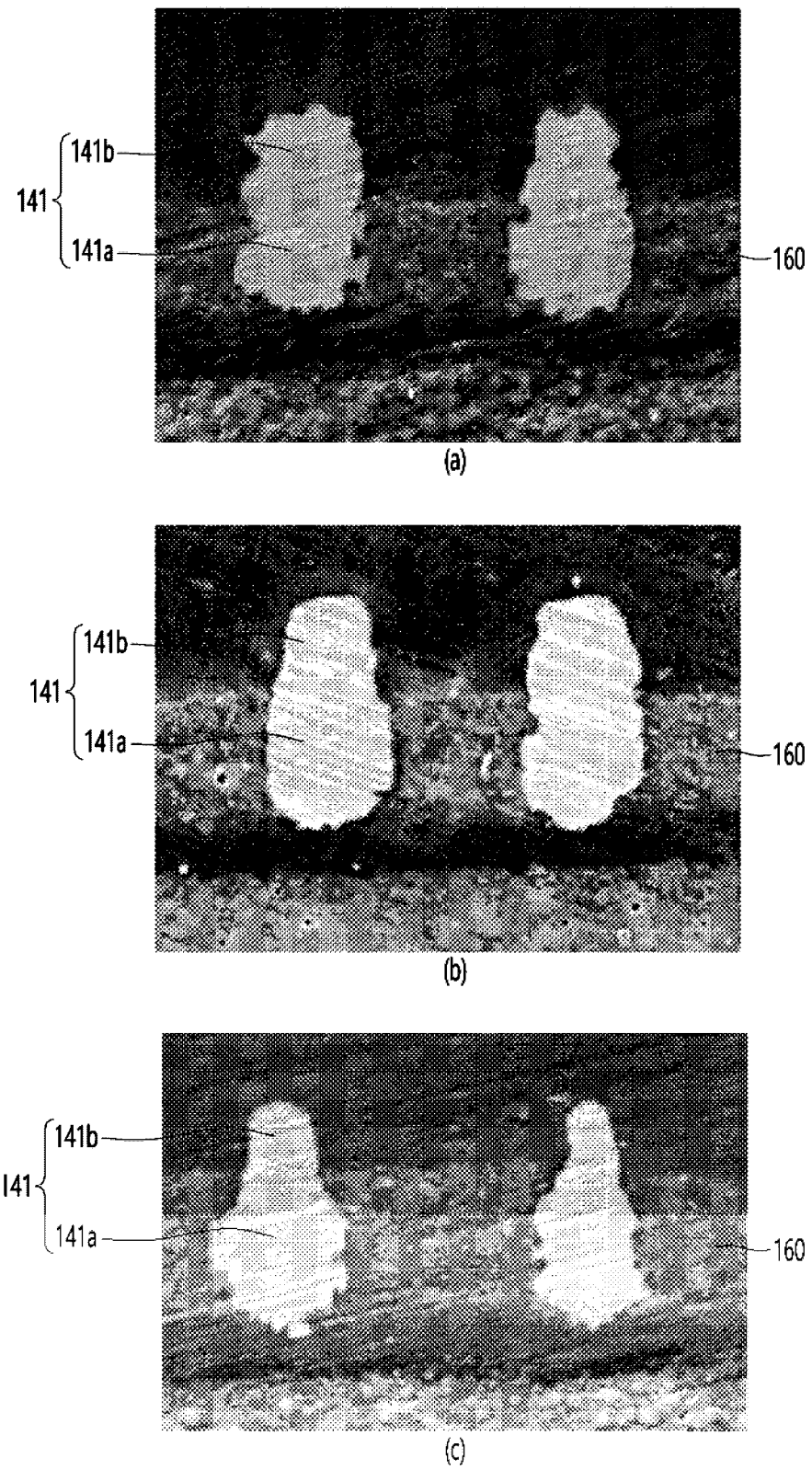

CIRCUIT BOARD

CROSS REFERENCE TO RELATED APPLICATIONS

This application is the National Phase of PCT International Application No. PCT/KR2021/019307, filed on Dec. 17, 2021, which claims priority under 35 U.S.C. 119(a) to Patent Application Nos. 10-2020-0177287, filed in Republic of Korea on Dec. 17, 2020 and 10-2020-0177383, filed in Republic of Korea on Dec. 17, 2020, all of which are hereby expressly incorporated by reference into the present application.

FIELD

The embodiment relates to a circuit board.

BACKGROUND ART

As miniaturization, weight reduction, and integration of electronic components are accelerated, a line width of a circuit is being miniaturized. In particular, as design rules of semiconductor chips are integrated on a nanometer scale, the line width of the circuit of package substrates on which semiconductor chips or circuit boards are mounted have been reduced to several micrometers or less.

In order to increase the degree of circuit integration of the circuit board (that is, in order to refine the line width of the circuit), various methods have been proposed. For example, in order to prevent loss of circuit line width in the step of etching to form a pattern after copper plating, a semi-additive process (SAP) method and a modified semi-additive process (MSAP) have been proposed.

Then, in order to implement a finer circuit pattern, an embedded trace substrate (ETS) method in which a copper foil is embedded in an insulating layer is used in the art. Since the ETS method manufactures a copper foil circuit by embedding it in the insulating layer instead of protruding it on the surface of the insulating layer, there is no circuit loss due to the etching, so it is advantageous to refine the circuit pitch.

Meanwhile, to meet the demand for wireless data traffic, efforts are being made to develop an improved 5th generation (5G) communication system or a pre-5G communication system. Here, the 5G communication system uses a high frequency (mmWave) band (e.g., 6 GHz, 28 GHz, 35 GHz) or higher frequencies to achieve a high data rate.

And, in order to alleviate the path loss of radio waves in the ultra-high frequency band and increase the propagation distance of radio waves, in the 5G communication system, integration technologies such as beamforming, massive MIMO, and array antenna are being developed. Considering that it can consist of hundreds of active antennas in these frequency bands, the antenna system becomes relatively large.

Since these antennas and AP modules are patterned or mounted on a circuit board, low loss of the circuit board is very important. This means that several substrates constituting an active antenna system, for example, an antenna substrate, an antenna feeding substrate, a transceiver substrate, and a baseband substrate, should be integrated into one compact unit.

And, the circuit board applied to the 5G communication system as described above is manufactured according to the trend of light, thin and compact, and accordingly, the circuit pattern is gradually becoming finer.

However, the circuit board including the conventional fine circuit pattern has a structure in which the outermost circuit pattern protrudes above the insulating layer, and thus the outermost circuit pattern easily collapses due to various factors.

SUMMARY

The embodiment provides a circuit board having a new structure and a method for manufacturing the same.

In addition, the embodiment provides a circuit board including a protective layer for supporting a circuit pattern disposed on an outermost side, and a method of manufacturing the same.

In addition, the embodiment provides a circuit board capable of minimizing deformation of an outermost circuit pattern and a method of manufacturing the same.

The technical problems to be achieved in the proposed embodiment are not limited to the technical problems mentioned above, and other technical problems not mentioned in the embodiments will be clearly understood by those of ordinary skill in the art to which the embodiments proposed from the description below.

A circuit board according to an embodiment includes an insulating layer; a circuit pattern disposed on the insulating layer; and a protective layer disposed on the insulating layer and the circuit pattern, and including first and second regions having different heights; wherein the circuit pattern includes: a first-first circuit pattern corresponding to the first region of the protective layer; and a first-second circuit pattern corresponding to the second region of the protective layer, wherein a height of the first region of the protective layer is lower than a height of the first-first circuit pattern, wherein a height of the second region of the protective layer is higher than a height of the first-second circuit pattern, wherein a surface of the first-first circuit pattern includes: a first portion in contact with the first region of the protective layer, and a second portion excluding the first portion, and wherein a surface roughness Ra of the first portion is different from a surface roughness Ra of the second portion.

In addition, the surface roughness Ra of the first portion is greater than the surface roughness Ra of the second portion.

In addition, the surface roughness Ra of the second portion satisfies 80% to 90% of the surface roughness Ra of the first portion.

In addition, a surface roughness Ra of the first-second circuit pattern is greater than the surface roughness Ra of the second portion of the first-first circuit pattern.

In addition, the surface roughness Ra of the first-second circuit pattern corresponds to the surface roughness Ra of the first portion of the first-first circuit pattern.

In addition, each of the surface roughness Ra of the first portion of the first-first circuit pattern and the first-second circuit pattern has a range of 510 nm to 580 nm, and wherein the surface roughness Ra of the second portion of the first-first circuit pattern has a range of 440 nm to 510 nm.

In addition, the height of the first region of the protective layer satisfies 70% to 90% of the height of the first-first circuit pattern.

In addition, the height of the second portion satisfies a range of 3 μm to 9 μm.

In addition, an upper surface of the protective layer includes: a first upper surface of the first region; and a second upper surface of the second region; wherein a surface roughness Ra of the first upper surface is different from a surface roughness Ra of the second upper surface.

In addition, the upper surface of the protective layer includes a boundary surface between the first upper surface and the second upper surface, and wherein a surface roughness Ra of the boundary surface is different from the surface roughness Ra of the first upper surface and the surface roughness Ra of the second upper surface.

In addition, a total height of the first-first circuit pattern is 12 μm or more.

In addition, the first-first circuit pattern includes a trace and a pad.

In addition, the height of the protective layer in the second region satisfies 110% to 400% of the height of the first-second circuit pattern.

In addition, a surface copper concentration of the second portion of the first-first circuit pattern is 90 wt % or more.

In addition, the insulating layer includes a plurality of insulating layers, and the circuit pattern is disposed to protrude on an upper surface of an uppermost insulating layer among the plurality of insulating layers.

In addition, a primer layer is disposed between the uppermost insulating layer and the circuit pattern, and between the uppermost insulating layer and the protective layer.

Meanwhile, a method of manufacturing a circuit board according to an embodiment includes manufacturing an inner layer substrate, forming an uppermost insulating layer on the inner layer substrate; forming a first-first circuit pattern and a first-first circuit pattern on a first region and a second region of the uppermost insulating layer, respectively; forming a roughness on the surfaces of the first-first circuit pattern and the first-second circuit pattern by first pre-processing the first-first circuit pattern and the first-second circuit pattern, forming a protective layer covering the first-first circuit pattern and the first-second circuit pattern on the uppermost insulating layer; partially exposing and developing the protective layer to have different heights in the first region and the second region; and second pre-processing of the first-first circuit pattern, wherein the having of the different heights includes exposing and developing so that the height of the protective layer in the first region is lower than the height of the first-first circuit pattern, the height of the protective layer in the second region is higher than the height of the first-second circuit pattern, wherein a surface of the first-first circuit pattern includes a first portion in contact with the protective layer in the first region, and a second portion excluding the first portion, and wherein the second pre-processing of the first-first circuit pattern includes etching under a condition that the surface roughness (Ra) of the second portion of the first-first circuit pattern satisfies 80% to 90% of the surface roughness (Ra) of the first portion.

In addition, the surface roughness Ra of the first-second circuit pattern corresponds to the surface roughness Ra of the first portion of the first-first circuit pattern.

In addition, each of the surface roughness Ra of the first portion of the first-first circuit pattern and the first-second circuit pattern has a range of 510 nm to 580 nm, and wherein the surface roughness Ra of the second portion of the first-first circuit pattern has a range of 440 nm to 510 nm.

In addition, the height of the first region of the protective layer satisfies 70% to 90% of the height of the first-first circuit pattern, and the height of the first portion of the first-first circuit pattern satisfies 70% to 90% of the total height of the first-first circuit pattern.

In addition, an upper surface of the protective layer includes: a first upper surface of the first region; a second upper surface of the second region; and a boundary surface between the first upper surface and the second upper surface, wherein the surface roughness (Ra) of the first upper surface is greater than the surface roughness (Ra) of the second upper surface, and the surface roughness Ra of the boundary surface is smaller than the surface roughness Ra of the first upper surface and greater than the surface roughness Ra of the second upper surface.

Advantageous Effects

The circuit board in this embodiment includes an outer layer circuit pattern disposed on an outermost side. In this case, the outer layer circuit pattern includes a second-first outer layer circuit pattern disposed in a first region of a protective layer and a second-second outer layer circuit pattern disposed on a second region of the protective layer. In this case, the second-second outer layer circuit pattern may be supported by the protective layer, since the second-first outer layer circuit pattern does not have a support layer capable of supporting it, it has a problem that it can easily collapse due to various factors.

Accordingly, in the embodiment, the second-first outer layer circuit pattern can be supported by using the protective layer. Therefore, in the embodiment, it is possible to solve problems such as collapsing or rubbing of the protruding outer layer circuit pattern by miniaturization of the outer layer circuit pattern, and accordingly, product reliability may be improved. In particular, in the embodiment, it is possible to solve problems such as collapsing or rubbing of the outer layer circuit pattern in the first region, and accordingly, product reliability may be improved.

In addition, in the embodiment, in forming the first region of the protective layer, it is removed using an exposure and development method instead of a sand blast method or a plasma method. At this time, when the protective layer is removed by sandblasting or plasma method, deformation of the circuit pattern of the outer layer may occur, and in some cases, the cross-section of the outer layer circuit pattern may have a triangular shape. And, when the cross-section of the outer layer circuit pattern has a triangular shape, an adhesive member cannot be stably disposed on the outer layer circuit pattern, and accordingly, a reliability problem may occur. In contrast, in the embodiment, the protective layer can be processed without deformation of the outer layer circuit pattern, and accordingly, reliability may be improved.

In addition, the second-first outer layer circuit pattern in the embodiment includes a first portion in contact with the protective layer and a second portion other than the first portion not in contact with the protective layer. Through this, in the embodiment, it is possible to minimize the degree of etching of the second portion occurring in the pretreatment process of the surface treatment. Accordingly, in the embodiment, the surface roughness Ra of the first portion of the second-first outer layer circuit pattern may be in a range of 510 nm to 580 nm. In addition, the surface roughness Ra of the second portion of the second-first outer layer circuit pattern may have a range of 440 nm to 510 nm, which is 80% to 90% of the surface roughness Ra of the first portion. Accordingly, in the embodiment, it is possible to minimize deformation of the second portion of the second-first outer layer circuit pattern, and accordingly, the reliability of the surface treatment process may be improved.

In addition, in the embodiment, the height of the second portion of the second-first outer layer circuit pattern (e.g., the difference between the height of the first region of the protective layer and the height of the second-first outer layer circuit pattern) should have a value between 3 μm and 9 μm. Accordingly, in the embodiment, it is possible to solve the reliability problem due to a portion of the upper surface of the second-first outer layer circuit pattern being covered with the protective layer. Furthermore, in the embodiment, it is possible to solve problems such as pattern deformation or pattern collapse that may occur as the height of the second portion of the second-first outer layer circuit pattern increases.

In addition, the circuit board in the embodiment is applicable to the 5G communication system. For example, the circuit board in the embodiment may be used to transmit a high-frequency signal. Furthermore, in the embodiment, it is possible to minimize transmission loss that may occur in the transmission of a high-frequency signal.

BRIEF DESCRIPTION OF THE DRAWINGS

FIGS. 1A and 1B are views illustrating a circuit board according to a first comparative example.

FIG. 2 is a view illustrating a circuit board of a second comparative example.

FIG. 3 is a view illustrating a circuit board according to an embodiment.

FIG. 4A is an enlarged view of an outermost region of the circuit board of FIG. 3.

FIG. 4B is a view specifically illustrating the circuit pattern of FIG. 4A.

FIGS. 5A to 5E are views illustrating reliability evaluation results according to a height of a second portion of an outer layer circuit pattern according to an embodiment.

FIG. 6 is a plan view illustrating a circuit board including a protective layer according to an embodiment.

FIG. 7 is a view illustrating an outer layer circuit pattern according to a comparative example.

FIGS. 8 to 18 are views illustrating the manufacturing method of the circuit Board Shown In FIG. 3 In Order Of Process.

DETAILED DESCRIPTION OF THE EMBODIMENTS

Hereinafter, embodiments disclosed in the present specification will be described in detail with reference to the accompanying drawings, but identical or similar elements are denoted by the same reference numerals regardless of reference numerals, and redundant descriptions thereof will be omitted. The suffixes "module" and "portion" for the components used in the following description are given or used interchangeably in consideration of only the ease of writing the specification, and do not have meanings or roles that are distinguished from each other by themselves. In addition, in describing the embodiments disclosed in the present specification, if it is determined that a detailed description of related known technologies may obscure the subject matter of the embodiments disclosed in the present specification, the detailed description thereof will be omitted. In addition, the accompanying drawings are only for making it easier to understand the embodiments disclosed in the present specification, and the technical idea disclosed in the present specification is not limited by the accompanying drawings, and this should be understood to include all changes, equivalents, or substitutes included in the spirit and scope of the present invention.

Terms including ordinal numbers such as first and second may be used to describe various elements, but the elements are not limited by the terms. The above terms are used only for the purpose of distinguishing one component from another component.

When a component is referred to as being "contacted" or "connected" to another component, it may be directly connected or connected to the other component, but other components may exist in the middle. On the other hand, when a component is referred to as being "directly contacted" or "directly connected" to another component, it should be understood that there is no other component in the middle.

Singular expressions include plural expressions unless the context clearly indicates otherwise.

In the present application, terms such as "comprises" or "have" are intended to designate the presence of features, numbers, steps, actions, components, parts, or combinations thereof described in the specification, but one or more other features. It is to be understood that the presence or addition of elements or numbers, steps, actions, components, parts, or combinations thereof, does not preclude in advance the possibility of being excluded.

Hereinafter, exemplary embodiments of the present invention will be described in detail with reference to the accompanying drawings.

Before describing the present embodiment, a comparative example to be compared with the present embodiment will be described.

FIGS. 1A and 1B are views illustrating a circuit board according to a first comparative example. Specifically, FIGS. 1A and 1B are views illustrating a circuit board manufactured by SAP method.

Referring to FIG. TA, the circuit board according to the comparative example may be manufactured by the SAP method.

Specifically, the circuit board of the comparative example includes an insulating layer 10, a circuit pattern 20, and a protective layer 30. In this case, the circuit pattern 20 is disposed on upper and lower surfaces of the insulating layer 10, respectively.

In this case, at least one of the circuit patterns 20 disposed on the surface of the insulating layer 10 may be a fine circuit pattern.

FIG. 1A shows that the circuit pattern 20 disposed on the upper surface of the insulating layer 10 is a fine circuit pattern. The fine circuit pattern includes a trace 21 which is a signal transmission wiring line and a pad 22 for chip mounting.

At this time, since a support layer using the protective layer is formed for the purpose of protecting the fine circuit pattern in the embodiment, the structure in the region where the fine circuit pattern is formed in the comparative example will be described.

An upper region of the insulating layer 10 in the comparative example includes a first region in which the protective layer 30 is disposed, and a second region that is an open region in which the protective layer 30 is not disposed.

Accordingly, a part of the circuit pattern 20 disposed on the upper surface of the insulating layer 10 is covered by the protective layer 30, and the remaining part is exposed to an outside without being covered by the protective layer 30.

In this case, as described above, in the second region that is the open region of the protective layer 30, the trace 21 and the pad 22 corresponding to the fine circuit pattern are disposed. For example, at least one of the trace 21 and the pad 22 has a width in a range of 10 μm to 15 μm, and a distance in a range of 10 μm to 15 μm.

Here, when the circuit pattern formed in the open region of the protective layer 30 is a general pattern (a pattern having a width exceeding 15 μm) rather than a fine circuit pattern, a reliability problem in the open region may not occur.

However, as shown in FIG. 1B, as the circuit pattern is gradually reduced, the width and distance of the trace 21 and the pad 22, which are the outermost fine circuit patterns, are gradually decreasing. Accordingly, when the fine circuit pattern protruding above the surface of the insulating layer 10 is disposed in the second region that is the open region of the protective layer 30, a reliability problem occurs in that the fine circuit pattern easily collapses due to an external impact.

For example, as shown in part B of FIG. 1B, the trace 21 corresponding to the outermost microcircuit pattern has a characteristic weak to external impact, and accordingly, there is a reliability problem that is easily collapsed or swept by various factors.

Meanwhile, recently, by using ETS method, a fine circuit pattern disposed in the open region of the protective layer is formed while having a structure buried in the insulating layer.

FIG. 2 is a view illustrating a circuit board of a second comparative example. Specifically, FIG. 2 is a view showing a circuit board manufactured by the ETS method.

Referring to FIG. 2, the circuit board includes an insulating layer 10A, a circuit pattern 20A, and a protective layer 30A.

The circuit pattern 20A is disposed on upper and lower surfaces of the insulating layer 10A, respectively.

At this time, at least one of the circuit patterns 20A disposed on the surface of the insulating layer TOA includes a fine circuit pattern.

Here, when the circuit pattern is formed by the ETS method, an initially formed circuit pattern formed has a structure buried in the insulating layer 10A. Accordingly, when the initially formed circuit pattern is formed as a fine circuit pattern, even in the comparative example, the fine circuit pattern may have a structure buried in the insulating layer 10A.

That is, the circuit board manufactured by the ETS method includes a fine circuit pattern having a structure buried in the surface of the insulating layer 10A. That is, the fine circuit pattern includes a trace 21A, which is a signal transmission wiring line, and a pad 22A for mounting a chip or the like.

And, in the case of the circuit board manufactured by the ETS method as described above, since the fine circuit pattern has a structure buried in the insulating layer, the fine circuit pattern can be protected from external impact.

At this time, there is no major problem in manufacturing the circuit board by the ETS method for the substrate having a two-layer structure (based on the number of layers of the circuit pattern) as in FIG. 2. However, in the case of manufacturing a circuit board having 8 or more layers, particularly, 10 or more layers by the ETS method, a lead time for manufacturing the circuit board takes at least 2 months or more, and thus productivity is lowered.

In addition, in order to manufacture the fine circuit pattern of the buried structure by the ETS method, the fine circuit pattern must be formed first in the manufacturing process of the multilayer circuit board. In addition, in order to be applied to an AP module of recent high integration/high specification, etc., circuit boards of 8 to 10 layers are required.

In this case, when the circuit board is manufactured by the ETS process, the fine circuit pattern is first formed during the manufacturing process. Accordingly, in the process of performing an additional lamination process after the fine circuit pattern is formed, damage is applied to the fine circuit pattern due to thermal stress or the like, and thus, there is a problem in that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, in the case of manufacturing a circuit board by the ETS method, the yield due to the cumulative tolerance is lowered when the layers are stacked more than a certain number of times, as a result, there is a problem in that the product cost increases, and there is a problem in that pattern damage due to stress increases as the lamination process is performed on both sides of the ETS core layer, respectively.

In addition, as 5G technology develops in recent years, interest in circuit boards that can reflect this is increasing. At this time, in order to apply the 5G technology, the circuit board must have a high multi-layer structure, and accordingly, the circuit pattern must be miniaturized. However, although it is possible to form a fine pattern in the comparative example, there is a problem in that it cannot be stably protected.

Accordingly, the embodiment is to provide a circuit board of a new structure capable of solving the reliability problem of the outermost fine circuit pattern and a manufacturing method thereof.

FIG. 3 is a view illustrating a circuit board according to an embodiment, FIG. 4A is an enlarged view of an outermost region of the circuit board of FIG. 3, and FIG. 4B is a view specifically illustrating the circuit pattern of FIG. 4A.

Before to the description of FIGS. 3, 4A, and 4B, the circuit board according to the embodiment may have a multi-layered structure. Preferably, the circuit board according to the embodiment may have a structure of 10 or more layers based on a number of layers of the circuit pattern. However, the embodiment is not limited thereto. That is, the circuit board according to the embodiment may have a number of layers less than 10, and alternatively may have a number of layers greater than 10 layers.

However, the circuit board of the embodiment is for solving the problem of the ETS method of the second comparative example. At this time, the ETS method in the second comparative example has many problems in manufacturing a circuit board of 8 or more layers, and accordingly, in the embodiment, the circuit board will be described as having a 10-layer structure for comparison.

Referring to FIGS. 3, 4A and 4B, the circuit board 100 includes an insulating layer 110. Preferably, the circuit board 100 may include first to ninth insulating layers 111, 112, 113, 114, 115, 116, 117, 118, 119 to implement a 10-layer circuit pattern structure.

At this time, among the insulating layers 110, the first insulating layer 111, the second insulating layer 112, the third insulating layer 113, the fourth insulating layer 114, the fifth insulating layer 115, the sixth insulating layer 116 and the seventh insulating layer 117 may be internal insulating layers disposed inside in the stacked insulating layer structure. The eighth insulating layer 118 may be an uppermost insulating layer (a first outermost insulating layer) disposed on the inner insulating layer. The ninth insulating layer 119 may be a lowermost insulating layer (a second outermost insulating layer) disposed below the inner insulating layer.

The first insulating layer 111 may be a core insulating layer disposed at the center in the stacked structure of the insulating layer 110. The second insulating layer 112, the fourth insulating layer 114, the sixth insulating layer 116, and the eighth insulating layer 118 may be upper insulating layers sequentially disposed on the first insulating layer 111. In addition, the third insulating layer 113, the fifth insulating layer 115, the seventh insulating layer 117, and the ninth insulating layer 119 may be lower insulating layers sequentially disposed under the first insulating layer 111.

The insulating layer 110 is a substrate on which an electric circuit capable of changing wiring is formed, and may include all of a printed circuit board, a wiring board, and an insulating substrate made of an insulating material capable of forming circuit patterns on the surface.

For example, at least one of the insulating layers 110 may be rigid or flexible. For example, at least one of the insulating layers 110 may include glass or plastic. In detail, at least one of the insulating layers 110 may include chemically strengthened/semi-tempered glass such as soda lime glass or aluminosilicate glass, or reinforced or flexible plastics such as polyimide (PI), polyethylene terephthalate (PET), propylene glycol (PPG) polycarbonate (PC), or sapphire.

In addition, at least one of the insulating layers 110 may include a photoisotropic film. For example, the insulating layer 310 may include Cyclic Olefin Copolymer (COC), Cyclic Olefin Polymer (COP), photoisotropic polycarbonate (PC), or photoisotropic polymethylmethacrylate (PMMA).

In addition, at least one of the insulating layers 110 may be bent while having a partially curved surface. That is, at least one of the insulating layers 110 may be bent while partially having a flat surface and partially having a curved surface. In detail, at least one of the insulating layers 110 may be bent while having a curved end or a surface including a random curvature, and may be bent or curved.

In addition, at least one of the insulating layers 110 may be a flexible substrate having flexible characteristics. In addition, at least one of the insulating layers 110 may be a curved or bent substrate. In this case, at least one of the insulating layers 110 represents an electrical wiring connecting circuit components based on a circuit design as a wiring diagram, and an electrical conductor may be reproduced on an insulating material. In addition, at least one of the insulating layers 110 may form a wiring for mounting electrical components and connecting them in a circuit, and mechanically fix components other than the electrical connection function of the components.

The insulating layer 110 as described above may be divided into a first region R1 and a second region R2 based on a region in which the protective layer 160 to be described later is disposed. The first region R1 and the second region R2 will be described later based on the protective layer.

A circuit pattern may be disposed on a surface of the insulating layer 110.

That is, circuit patterns may be disposed on each of surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner circuit pattern 120 is an inner circuit pattern disposed inside the insulating layer 110 in the stacked structure of the circuit board, and the outer layer circuit patterns 130 and 140 may be circuit patterns disposed on the outermost side of the insulating layer 110 in the stacked structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit 126 and a seventh circuit pattern 127.

The first circuit pattern 121 may be disposed on an upper surface of the first insulating layer 111, and thus may be covered by the second insulating layer 112. The second circuit pattern 122 may be disposed on a lower surface of the first insulating layer 111, and thus may be covered by the third insulating layer 113. The third circuit pattern 123 may be disposed on an upper surface of the second insulating layer 112, and thus may be covered by the fourth insulating layer 114. The fourth circuit pattern 124 may be disposed on a lower surface of the third insulating layer 113, and thus may be covered by the fifth insulating layer 115. The fifth circuit pattern 125 may be disposed on an upper surface of the fourth insulating layer 114, and thus may be covered by the sixth insulating layer 116. The sixth circuit pattern 126 may be disposed on a lower surface of the fifth insulating layer 115, and thus may be covered by the seventh insulating layer 117. The seventh circuit pattern 127 may be disposed on an upper surface of the sixth insulating layer 116, and thus may be covered by the eighth insulating layer 118. The eighth circuit pattern 128 may be disposed on a lower surface of the seventh insulating layer 117, and thus may be covered by the ninth insulating layer.

The outer circuit pattern may be disposed on the surface of the outermost insulating layer disposed at the outermost of the insulating layers 110. Preferably, the outer circuit pattern may include a first outer circuit pattern 130 disposed on a lower surface of the ninth insulating layer 119 disposed at the lowermost portion of the insulating layer 110.

In addition, the outer circuit pattern may include a second outer circuit pattern 140 disposed on an upper surface of the eighth insulating layer 118 disposed on the uppermost portion of the insulating layer 110.

In this case, at least one of the first outer layer circuit pattern 130 and the second outer layer circuit pattern 140 may be formed to protrude above the surface of the insulating layer. Preferably, the first outer layer circuit pattern 130 may protrude below the lower surface of the ninth insulating layer 119. Also, the second outer layer circuit pattern 140 may protrude above the upper surface of the eighth insulating layer 118.

That is, the circuit board in the embodiment is manufactured by the SAP method, and accordingly, the circuit patterns disposed on the outermost side may all protrude from the surface of the insulating layer.

That is, the upper surface of the first outer layer circuit pattern 130 may be positioned on the same plane as the lower surface of the ninth insulating layer 119. In addition, the lower surface of the second outer layer circuit pattern 140 may be positioned on the same plane as an upper surface of a primer layer 150 disposed on the upper surface of the eighth insulating layer 180.

In other words, the primer layer 150 may be disposed between the eighth insulating layer 180 and the second outer layer circuit pattern 140.

That is, the second outer layer circuit pattern 140 may include a fine circuit pattern. Preferably, the second outer layer circuit pattern 140 may be a fine circuit pattern having a line width of 10 μm or less and a distance between the patterns of 10 μm or less. Accordingly, when the second outer circuit pattern 140 is directly disposed on the eighth insulating layer 118, a contact area between the eighth insulating layer 118 and the second outer layer circuit pattern 140 is small, and accordingly, a problem in that the second outer layer circuit pattern 150 is separated from the eighth insulating layer 118 may occur.

Accordingly, in the embodiment, the primer layer 150 may be disposed between the second outer layer circuit pattern 140 and the eighth insulating layer 118.

The primer layer 150 may improve adhesion between the second outer circuit pattern 140 and the eighth insulating layer 118. The primer layer 150 may be disposed to completely cover the upper surface of the eighth insulating layer 118. In addition, the second outer layer circuit pattern 140 may be partially disposed on the primer layer 150. Accordingly, the upper surface of the primer layer 150 in the embodiment may include a first portion in contact with the second outer layer circuit pattern 140 and a second portion in contact with the lower surface of the protective layer 160 to be described later. That is, the primer layer 150 improves the bonding strength between the eighth insulating layer 118 and the second outer circuit pattern 140 when the second outer layer circuit pattern 140 is formed by the SAP process. Such a primer layer 150 may include a polyurethane-based resin, an acrylic resin, or a silicone-based resin, but is not limited thereto.

Meanwhile, in FIG. 3, the primer layer is not disposed between the ninth insulating layer 119 and the first outer layer circuit pattern 130, but the primer layer may also be disposed between the ninth insulating layer 119 and the first outer layer circuit pattern 130. However, when the first outer circuit pattern 130 is not a fine circuit pattern, the primer layer between the ninth insulating layer 119 and the first outer circuit pattern 130 may be omitted.

Consequently, when the fine circuit pattern is disposed on the inner layer, the primer layer may be omitted as the fine circuit pattern of the inner layer is covered by at least one of the insulating layers 110. On the other hand, in the embodiment, when the fine circuit pattern is disposed on the outermost layer, since the insulating layer covering the microcircuit pattern does not exist, and the primer layer 150 is disposed to improve bonding strength between the microcircuit pattern and the insulating layer.

Hereinafter, it will be described that the second outer layer circuit pattern 140 is formed as a fine circuit pattern. However, the embodiment is not limited thereto, and the first outer layer circuit pattern 130 may also be formed of a fine circuit pattern, Accordingly, it will be apparent that a structure for improving reliability, such as strengthening the bonding strength and preventing collapsing of the second outer layer circuit pattern 140, which will be described below, can also be applied to the first outer layer circuit pattern 130.

The inner layer circuit pattern 120, the first outer layer circuit pattern 130, and the second outer layer circuit pattern 140 are wirings that transmit electrical signals, and may be formed of a metal material having high electrical conductivity. To this end, the inner circuit pattern 120, the first outer circuit pattern 130, and the second outer circuit pattern 140 may formed of at least one metal material selected from among gold (Au), silver (Ag), platinum (Pt), titanium (Ti), tin (Sn), copper (Cu), and zinc (Zn). In addition, the inner circuit pattern 120, the first outer circuit pattern 130, and the second outer circuit pattern 140 may be formed of a paste or solder paste containing one metal material of gold (Au), silver (Ag), platinum (Pt), titanium (Ti), tin (Sn), copper (Cu), and zinc (Zn) having excellent bonding strength. Preferably, the inner circuit pattern 120, the first outer circuit pattern 130, and the second outer circuit pattern 140 may be formed of copper (Cu) having high electrical conductivity and a relatively inexpensive price.

The first outer layer circuit pattern 130 and the second outer layer circuit pattern 140 are outermost circuit patterns disposed on the outermost side of the circuit board. The first outer layer circuit pattern 130 and the second outer layer circuit pattern 140 may have a protruding structure as they are formed by a semi-additive process (SAP) method.

Meanwhile, a via V may be disposed in the insulating layer 110. The vias V are disposed in each insulating layer, and thus may serve to electrically connect circuit patterns disposed in different layers to each other.

A first via V1 may be disposed in the first insulating layer 111. The first via V1 may be electrically connected the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may be electrically connected the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may be electrically connected the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may be electrically connected the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may be electrically connected the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may be electrically connected the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may be electrically connected the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may be electrically connected the seventh circuit pattern 127 disposed on the upper surface of the sixth insulating layer 116 and the second outer circuit pattern 140 disposed on the upper surface of the primer layer 150.

A ninth via V9 may be disposed in the ninth insulating layer 119. The ninth via V9 may be electrically connected the eighth circuit pattern 128 disposed on the lower surface of the seventh insulating layer 117 and the first outer circuit pattern 130 disposed on the lower surface of the ninth insulating layer 119.

The via V as described above may be formed by filling the inside of the via hole formed in each insulating layer with a metal material.

When the via hole is formed by mechanical processing, methods such as milling, drilling, and routing may be used, and when the via hole is formed by laser processing, a UV or $CO_2$ laser method may be used, and when the via hole is formed by chemical processing, drugs containing aminosilane, ketones, etc. may be used, and the like, thereby the insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the via hole is formed, the first to ninth via V1, V2, V3, V4, V5, V6, V7, V8, V9 is formed by filling the inside of the via hole with a conductive material. The metal material forming the first to ninth via V1, V2, V3, V4, V5, V6, V7, V8, V9 may be any one material selected from copper (Cu), silver (Ag), tin (Sn), gold (Au), nickel (Ni), and palladium (Pd), and the conductive material may be filled using any one or a combination of electroless plating, electrolytic plating, screen printing, sputtering, evaporation, inkjetting and dispensing.

Meanwhile, a protective layer may be disposed on the outermost side of the circuit board 100. Preferably, a first protective layer 160 may be disposed on the eighth insulating layer 118 (preferably, on the primer layer 150). Also, a second protective layer 175 may be disposed under the ninth insulating layer 119.

The first protective layer 160 and the second protective layer 175 may be formed of at least one layer using any one or more of Solder Resist (SR), oxide, and Au. Preferably, the first protective layer 160 and the second protective layer 175 may be solder resist.

Meanwhile, a first protective layer 160 is disposed on the primer layer 150. The first protective layer 160 may serve to protect the surface of the second outer circuit pattern 140 while supporting the second outer circuit pattern 140 disposed on the primer layer 150.

That is, the first protective layer 160 may partially overlap the second outer layer circuit pattern 140 disposed on the primer layer 150. An area of the first protective layer 160 may be smaller than an area of the eighth insulating layer 118. An area of the first protective layer 160 may be smaller than an area of the primer layer 150. The first protective layer 160 is partially or entirely disposed on the primer layer 150 and the second outer layer circuit pattern 140, and thus an open region exposing the surface of the second outer layer circuit pattern 140 may be included.

The first protective layer 160 may include an open region or a first region R1 having a groove-like shape. The first region R1 may refer to a region (e.g., an exposed region) in which the surface of the second outer layer circuit pattern 140 is not covered by the first protective layer 160.

That is, the circuit board includes a first region R1 and a second region R2. The first region R1 is an open region in which the surface of the second outer layer circuit pattern 140 must be exposed through the first protective layer 160, and the second region R2 may be a buried region in which the surface of the second outer layer circuit pattern 140 is covered by the first protective layer 160.

That is, the first region R1 may be a region in which the first protective layer 160 for electrically connecting the second outer layer circuit pattern 140 to a component such as a chip is not disposed. Accordingly, the second outer layer circuit pattern 140 disposed on the first region R1 may be disposed without a protective layer protecting it.

In addition, the second outer layer circuit pattern 140 disposed in the first region R1 as described above may have reliability problems such as collapsing or rubbing due to various factors. Moreover, the second outer layer circuit pattern 140 is a fine circuit pattern, and thus may have a line width of 10 μm or less and a distance of 10 μm or less. Accordingly, the second outer layer circuit pattern 140 disposed on the first region R1 may have reliability problems such as easily collapsing or rubbing even with various small external impacts.

Accordingly, in the embodiment, in order to improve the reliability of the second outer layer circuit pattern 140 disposed on the first region R1, the first protective layer 160 is also disposed on the first region R1.

That is, the first protective layer 160 may be disposed on the upper surface of the primer layer 150 in a region where the second outer layer circuit pattern 140 is not disposed. For example, the first protective layers 160 and 170 are disposed on the upper surface of the primer layer 150, and accordingly, it may be disposed between the second outer layer circuit patterns 140 on the first region R1.

In this case, the second outer layer circuit pattern 140 includes a second-first outer layer circuit pattern 140a formed in the first region R1 and a second-second outer layer circuit pattern 140b formed in the second region R2.

The upper surface of the primer layer 150 includes a first upper surface corresponding to the first region R1 and a second upper surface corresponding to the second region R2.

At this time, as shown in FIGS. 3, 4A and 4B, the first protective layer 160 does not separate the first region R1 and the second region R2, and is entirely disposed on the primer layer 150, and accordingly, they may be respectively disposed in the region between the second-first outer layer circuit patterns 140a and the region between the second-second outer layer circuit patterns 140b.

Accordingly, the first protective layer 160 includes a first portion disposed in the first region R1 and a second portion disposed in the second region R2.

In this case, the first protective layer 160 may have different heights for each region.

For example, the first protective layer 160 may include a first region R1 and a second region R2.

In this case, the first region R1 may mean a region in which the surface of the second outer layer circuit pattern 140 is not covered with the first protective layer 160, and the second region R2 may mean a region in which the surface of the second outer layer circuit pattern 140 is covered with the first protective layer 160.

An upper surface of the first region R1 of the first protective layer 160 may be positioned lower than an upper surface of the second outer layer circuit pattern 140. Preferably, the height or thickness of the first region R1 of the first protective layer 160 may be smaller than the height or thickness of the second outer layer circuit pattern 140.

Also, an upper surface of the second region R2 of the first protective layer 160 may be positioned higher than an upper surface of the second outer layer circuit pattern 140. Preferably, the height or thickness of the second region R2 of the first protective layer 160 may be greater than the height or thickness of the second outer layer circuit pattern 140.

Accordingly, the surface of the second-first outer layer circuit pattern 140a in the first region R1 may not contact the first protective layer 160 due to the low height of the first protective layer 160. In addition, the second-second second outer layer circuit pattern 140b in the second region R2 may be covered with the first protective layer 160.

Hereinafter, the first protective layer 160 will be described in detail.

The first protective layer 160 may be disposed on the primer layer 150. The first protective layer 160 is a solder resist.

The first protective layer 160 may be disposed between the second outer layer circuit patterns 140 on the primer layer 150. That is, the second outer layer circuit pattern 140 is disposed on the primer layer 150 spaced apart from each other, and accordingly, the first protective layer 160 may be disposed on a region of the upper surface of the primer layer 150 where the second outer layer circuit pattern 140 is not disposed.

Hereinafter, the first protective layer 160 will be described as a 'protective layer 160'.

The protective layer 160 may be disposed on a region of the upper surface of the primer layer 150 on which the second outer layer circuit pattern 140 is not disposed.

A height of the first region R1 of the protective layer 160 may be smaller than a height of the second outer layer circuit pattern 140. Preferably, an upper surface of the first region R1 of the protective layer 160 may be positioned lower than an upper surface of the second outer layer circuit pattern 140. Accordingly, a part of a side surface of the second outer layer circuit pattern 140 in the first region R1 may contact the protective layer 160, and the remaining part may not contact the protective layer 160.

Here, the first region R1 of the protective layer 160 may be formed to surround the second-first outer layer circuit pattern 140a. Accordingly, the first region R1 of the protective layer 160 may serve to prevent collapsing or rubbing of the second-first outer layer circuit pattern 140a.

The protective layer 160 may be formed of a photo-solder resist film. Accordingly, the protective layer 160 may have a structure in which a resin and a filler are mixed.

In addition, the second region R2 of the protective layer 160 may be disposed to cover the second-second second outer layer circuit pattern 140b.

The first region R1 of the protective layer 160 may have a first height. In addition, the second region R2 of the protective layer 160 may have a second height greater than the first height. In this case, the first height is smaller than the height of the second outer layer circuit pattern 140, and the second height is greater than the height of the second outer layer circuit pattern 140.

Accordingly, the upper surface of the first region R1 of the protective layer 160 having the first height may be positioned lower than the upper surface of the second outer layer circuit pattern 140, and the upper surface of the second region R2 of the protective layer 160 having the second height may be positioned higher than the upper surface of the second outer layer circuit pattern 140.

Here, making the protective layer 160 to have different heights for each region may be achieved by selectively removing only the first region R1 of the protective layer 160 by exposing and developing the protective layer 160

On the other hand, the protective layer 160 may include a filler such as $BaSO_4$, $SiO_2$, Talc, and the content thereof may be 20 wt % to 35 wt %.

In this case, when the content of filler in the protective layer 160 is less than 20 wt %, the second outer layer circuit pattern 140 may not be stably protected by the protective layer 160. In addition, when the content of the filler included in the protective layer 160 is greater than 35 wt %, when the first region R1 of the protective layer 160 is formed, a filler may remain on the surface of the second outer layer circuit pattern 140. In addition, a reliability problem of the second outer layer circuit pattern 140 may occur due to the remaining filler, or an additional process of removing the remaining filler must be performed.

As described above, in the embodiment, the protective layer 160 having different heights for each region may be formed by forming a protective layer on the uppermost insulating layer, and selectively removing the first region R1 of the formed protective layer.

Accordingly, the protective layer 160 may have a lower height than the second-first outer layer circuit pattern 140a in the first region R1 and may not contact the upper surface of the second-first outer layer circuit pattern 140a. In addition, the protective layer 160 may be disposed to cover the second-second outer layer circuit pattern 140b in the second region R2.

Meanwhile, the second outer layer circuit pattern 140 may include traces 141 and pads 142 according to functions. The pad 142 may be a region in which an adhesive member (not shown) is disposed for connection with an electronic component such as a chip. Also, the trace 141 may be a wiring line connecting different pads. Here, the pad 142 generally has a larger width than that of the trace, and thus the pad 142 may have a characteristic strong against external impact. However, the traces 141 are disposed to have a width and a distance corresponding to the fine circuit pattern as described above, and thus may have a weak characteristic against external impact. Accordingly, the first region R1 of the protective layer 160 may serve to stably support the trace 141 of the second-first outer layer circuit pattern 140a.

That is, the second outer layer circuit pattern 140 may include a second-first outer layer circuit pattern 140a disposed in the first region R1 of the protective layer 160. The second-first outer layer circuit pattern 140a may include a trace 141 and a pad 142. In addition, the second outer layer circuit pattern 140 may include a second-second outer layer circuit pattern 140b disposed in the second region R2 of the protective layer 160.

Meanwhile, as shown in FIG. 4A, the second outer layer circuit pattern 140 may have a first height H1 and may be disposed on the primer layer 150. The protective layer 160 may include a first region R1 and a second region R2. Preferably, the circuit board includes a first region R1 and a second region R2. Correspondingly, the insulating layer 110 also includes a first region R1 and a second region R2. In addition, the protective layer 160 also includes a first region R1 and a second region R2 corresponding thereto.

In this case, the upper surface 161 of the first region R1 of the protective layer 160, the upper surface 162 of the second region R2, and a boundary surface 163 (or a boundary side surface) therebetween may have different surface roughness.

The first region R1 of the protective layer 160 may have a second height H2 and may be disposed on the primer layer 150. In addition, the second region R2 of the protective layer 160 may have a third height H3 and be disposed on the primer layer 150.

In this case, the second height H2 is smaller than the first height H1. Preferably, the first region R1 of the protective layer 160 may be disposed on the primer layer 150 while having a height smaller than that of the second-first outer layer circuit pattern 140a. In this case, the second height H2 may be 70% to 90% of the first height H1. For example, when the second height H2 is less than 70% of the first height H1, the second-first outer layer circuit pattern 140a may not be stably supported by the protective layer 160. For example, when the second height H2 is less than 70% of the first height H1, there is a difficulty in forming the protective layer 160. For example, when the second height H2 is greater than 90% of the first height H1, a part of the filler included in the protective layer 160 may remain on the second-first outer layer circuit pattern 140a. For example, when the second height H2 is greater than 90% of the first height H1, due to a deviation in the process of forming the protective layer 160, the surface of the second-first outer layer circuit pattern 140a may be covered with the protective layer 160.

Meanwhile, the third height H3 may be greater than the first height H1 and the second height H2. Preferably, the third height H3 may be 110% to 400% of the first height H1. For example, when the third height H4 is smaller than 110% of the first height H1, the surface of the second-second outer layer circuit pattern 140b in the second region R2 may not be stably protected by the protective layer 160. For example, when the third height H3 is greater than 400% of the first height H1, the overall thickness of the circuit board may increase.

Meanwhile, referring to FIG. 4B, roughness may be formed on the surface of the second outer layer circuit pattern 140. For example, as a pretreatment process performed before the protective layer 160 is formed, roughness may be formed on the surface of the second outer layer circuit pattern 140. The pretreatment may be to increase the bonding strength (or adhesion) between the second outer layer circuit pattern 140 and the protective layer 160.

In this case, the second outer layer circuit pattern 140 in the embodiment may have different surface roughness for each region. For example, the surface of the second-first outer layer circuit pattern 140a formed in the first region R1 of the protective layer 160 includes a first portion 140a-1 covered with the protective layer 160 and a second portion 140a-2 exposed through the open region of the protective layer 160 (or not in contact with the protective layer).

Here, the surface roughness Ra of the first portion 140a-1 of the second-first outer circuit pattern 140a may be different from the surface roughness (Ra) of the second portion 140a-2 of the second-first outer circuit pattern 140a. For example, the surface roughness Ra of the first portion 140a-1 may be greater than the surface roughness Ra of the second portion 140a-2. Preferably, the surface roughness Ra of the second portion 140a-2 may be 80% to 90% of the surface roughness Ra of the first portion 140a-1. More preferably, the surface roughness Ra of the second portion 140a-2 may be 85% to 88% of the surface roughness Ra of the first portion 140a-1. The difference between the surface roughness Ra of the first portion 140a-1 and the surface roughness Ra of the second portion 140a-2 may be due to a pretreatment process that is essentially performed during the surface treatment process of the second-first outer layer circuit pattern 140a.

That is, in general, a surface treatment process is performed on the surface of the circuit pattern exposed in the first region R1 of the protective layer 160. For example, a surface treatment process is performed on the second portion 140a-2 of the second-first outer layer circuit pattern 140a. The surface treatment process may be any one of an organic solderability preservative (OSP) process and an ENEPIG (gold plating) process. And, in the pretreatment process for the surface treatment, the pretreatment of the second portion 140a-2 of the second-first outer layer circuit pattern 140a is performed. For example, in the pretreatment process for the surface treatment, the second portion 140a-2 of the second-first outer layer circuit pattern 140a is etched. In this case, the degree of difference in surface roughness Ra between the first portion 140a-1 and the second portion 140a-2 is determined based on the etching degree of the second portion 140a-2 performed in the pretreatment process. In this case, the reliability of the surface treatment process may be determined according to conditions of the pretreatment process. For example, depending on the condition of the pretreatment process, the etching is too small, and thus, a reliability problem occurs because the surface treatment process is not performed normally. For example, when the etching is made too small depending on the condition of the pretreatment process, a reliability problem occurs as the surface treatment process is not performed normally. For example, when the etching is done too much according to the condition of the pretreatment process, the surface roughness Ra of the second portion 140a-2 appears too low, and accordingly, bonding strength with the surface treatment layer may decrease. For example, when the etching is done too much according to the condition of the pretreatment process, deformation of the second portion 140a-2 may occur. In this case, the second portion 140a-2 is a part of the fine circuit pattern. Accordingly, when the second portion 140a-2 is a pad and its deformation occurs, the adhesive member (not shown) may not be stably disposed on the second portion 140a-2. In addition, when the second portion 140a-2 is a trace and its deformation occurs, a problem may occur in signal transmission reliability through the fine circuit pattern. Accordingly, in the embodiment, by adjusting the condition of the pretreatment process of the surface treatment, it is possible to solve the reliability problem of the second portion 140a-2 that occurs after the pretreatment process.

Therefore, the embodiment, as described above, the surface roughness Ra of the second portion 140a-2 may be in a range of 80% to 90% of the surface roughness Ra of the first portion 140a-1. More preferably, the surface roughness Ra of the second portion 140a-2 is in a range of 85% to 88% of the surface roughness Ra of the first portion 140a-1. For example, when the surface roughness Ra of the second portion 140a-2 is less than 80% of the surface roughness of the first portion 140a-1, this means that deformation of the second portion 140a-2 occurred after the pretreatment process, and accordingly, a reliability problem may occur. In addition, when the surface roughness Ra of the second portion 140a-2 is greater than 90% of the surface roughness of the first portion 140a-1, this means that the etching degree in the pretreatment process was too weak, and accordingly, the reliability of the surface treatment process may be reduced.

In this case, the surface roughness Ra of the first portion 140a-1 may be in a range of 510 nm to 580 nm. The surface roughness Ra of the second portion 140a-2 may have a range between 440 nm and 510 nm, which is 80% to 90% of the surface roughness Ra of the first portion 140a-1.

At this time, the surface roughness Ra of the first portion 140a-1 of the second-first outer layer circuit pattern 140a may be provided by a first pretreatment process before forming the protective layer 160. The surface roughness Ra of the second portion 140a-2 of the second-first outer layer circuit pattern 140a may be provided by a second pretreatment process performed before the surface treatment process.

Meanwhile, the second-second outer layer circuit pattern 140b may have the same surface roughness Ra as a whole. That is, the second-second outer layer circuit pattern 140b is formed in the second region R2 of the protective layer 160. Both the side and upper surfaces of the second-second outer circuit pattern 140b may be covered by the protective layer 160. Accordingly, the second-second outer layer circuit pattern 140b may not be etched in a second pretreatment process of the surface treatment process.

Accordingly, the second-second outer circuit pattern 140b may have the same surface roughness Ra as the first portion 140a-1 of the second-first outer circuit pattern 140a. For example, the side surface (clearly, the entire side surface and the entire upper surface) of the second-second outer layer circuit pattern 140b has the same surface roughness Ra in the range of 510 nm to 580 nm as that of the first portion 140a-1.

As described above, in the embodiment, in the second pretreatment process of the surface treatment process, the etching degree of the second portion 140a-2 of the second-first outer layer circuit pattern 140a exposed through the first region R1 of the protective layer 160 is minimized. Accordingly, the surface roughness Ra of the first portion 140a-1 of the second-first outer layer circuit pattern 140a may be in a range of 510 nm to 580 nm. The surface roughness Ra of the second portion 140a-2 of the second-first outer layer circuit pattern 140a is 80% to 90% of the surface roughness Ra of the first portion 140a-1, and it may range between 440 nm and 510 nm. Accordingly, in the embodiment, it is possible to minimize the deformation of the second portion 140a-2 of the second-first outer layer circuit pattern 140a, and accordingly, the reliability of the surface treatment process may be improved.

Meanwhile, in an embodiment, the height or thickness of the second portion 140a-2 of the second-first outer layer circuit pattern 140a may have a value between 3 μm and 9 μm. That is, the height or thickness of the second portion 140a-2 of the second-first outer layer circuit pattern 140a may correspond to a difference value H1-H2 between the first height H1 and the second height H2.

In this case, it is preferable that the height H1 of the second-first outer layer circuit pattern 140a in the embodiment is 12 μm or more. When the height H1 of the second-first outer layer circuit pattern 140a is less than 12 μm, it may be difficult to implement a normal circuit pattern. Also, when the height H1 of the second-first outer layer circuit pattern 140a is less than 12 μm, signal transmission performance may be deteriorated (e.g., signal transmission loss may be increased). Accordingly, in the embodiment, under the condition that the height H1 of the second-first outer layer circuit pattern 140a is 12 μm or more, the height of the second portion 140a-2 of the second-first outer layer circuit pattern 140a may have a value between 3 μm and 9 μm.

For example, the height of the second portion 140a-2 of the second-first outer layer circuit pattern 140a may have a value between 3 μm and 9 μm regardless of the overall height H1 of the second-first outer layer circuit pattern 140a.

When the height of the second portion 140a-2 of the second-first outer layer circuit pattern 140a is less than 3 μm, there is a problem in that residual resin of the protective layer 160 remains on the surface of the second portion 140a-2 of the second-first outer layer circuit pattern 140a. For example, when the height of the second portion 140a-2 of the second-first outer layer circuit pattern 140a is less than 3 μm, there is a problem in that the copper (Cu) concentration on the upper surface of the second portion 140a-2 is 90 wt % or less. That is, when the copper (Cu) concentration on the surface of the second portion 140a-2 of the second-first outer layer circuit pattern 140a is 90 wt % or less, there is a problem in that the reliability of the second-first outer layer circuit pattern 140a is reduced.

In addition, when the height of the second portion 140a-2 of the second-first outer layer circuit pattern 140a is greater than 9 μm, the second-first outer layer circuit pattern 140a may not be stably supported by the first region R1 of the protective layer 160. In addition, when the height of the second portion 140a-2 of the second-first outer layer circuit pattern 140a is greater than 9 μm, there is a problem that the second portion 140a-2 may be deformed in the second pre-treatment process for surface treatment.

Hereinafter, reliability evaluation results according to the height of the second portion 140a-2 of the second-first outer layer circuit pattern 140a will be described.

FIGS. 5A to 5E are views illustrating reliability evaluation results according to a height of a second portion of an outer layer circuit pattern according to an embodiment.

FIG. 5A (a) is a cross-sectional view when the height of the second portion 140a-2 of the second-first outer layer circuit pattern 140a is 7 μm, and (b) is a view illustrating the results of Energy Dispersive X-ray Spectroscopy (EDS) of the surface of the second portion 140a-2 according to this.

As described above, when the height of the second portion 140a-2 is 7 μm, the results of EDS analysis on the surface of the second portion 140a-2 are shown in Table 1 below.

TABLE 1

| Ingredient | wt % |
| --- | --- |
| C | 6.51 |
| Cu | 93.49 |

As described above, when the height of the second portion 140a-2 is 7 μm, it can be confirmed that the Cu concentration on the surface of the second portion 140a-2 is 93.49 wt %.

FIG. 5B (a) is a cross-sectional view when the height of the second portion 140a-2 of the second-first outer layer circuit pattern 140a is 3 μm, and (b) is a view illustrating the results of Energy Dispersive X-ray Spectroscopy (EDS) of the surface of the second portion 140a-2 according to this.

As described above, when the height of the second portion 140a-2 is 3 μm, the results of EDS analysis on the surface of the second portion 140a-2 are shown in Table 2 below.

TABLE 2

| Ingredient | wt % |
| --- | --- |
| C | 6.19 |
| Cu | 93.81 |

As described above, when the height of the second portion 140a-2 was 3 μm, it was confirmed that the Cu concentration on the surface of the second portion 140a-2 was 93.81 wt %.

FIG. 5C (a) is a cross-sectional view when the height of the second portion 140a-2 of the second-first outer layer circuit pattern 140a is 1 μm, and (b) is a view illustrating the results of Energy Dispersive X-ray Spectroscopy (EDS) of the surface of the second portion 140a-2 according to this.

As described above, when the height of the second portion 140a-2 is 1p m, the EDS analysis results for the surface of the second portion 140a-2 are shown in Table 3 below.

TABLE 3

| ingredient | wt % |
|---|---|
| C | 17.65 |
| Cu | 82.35 |

As described above, when the height of the second portion 140a-2 is 1 μm smaller than 3 μm, it was confirmed that the Cu concentration on the surface of the second portion 140a-2 was 82.35 wt %. That is, as the height of the second portion 140a-2 became smaller than 3 μm, it was confirmed that the Cu concentration on the surface of the second portion 140a-2 rapidly decreased.

FIG. 5D (a) is a cross-sectional view when the height of the second portion 140a-2 of the second-first outer layer circuit pattern 140a is −2 μm, and (b) is a view illustrating the results of Energy Dispersive X-ray Spectroscopy (EDS) of the surface of the second portion 140a-2 according to this. That is, FIG. 5D shows the reliability evaluation result under the condition that the solder resist 160 is higher than that of the second-first outer layer circuit pattern 140a.

As described above, when the height of the second portion 140a-2 is −2 μm, the results of EDS analysis on the surface of the second portion 140a-2 are shown in Table 4 below.

TABLE 4

| Ingredient | wt % |
|---|---|
| C | 17.65 |
| Cu | 79.90 |

As described above, when the height of the second portion 140a-2 is −2 μm as described above, it was confirmed that the Cu concentration on the surface of the second portion 140a-2 was 79.90 wt %.

FIG. 5E (a) is a cross-sectional view when the height of the second portion 140a-2 of the second-first outer layer circuit pattern 140a is 9 μm, (b) is a cross-sectional view when the height of the second portion 140a-2 of the second-first outer layer circuit pattern 140a is 12 μm, and (c) is a cross-sectional view when the height of the second portion 140a-2 of the second-first outer layer circuit pattern 140a is 10 μm.

As described above, after the second-first outer layer circuit pattern 140a is formed, a surface treatment process of the second-first outer layer circuit pattern 140a is performed. At this time, in the surface treatment process of the second-first outer layer circuit pattern 140a, as a pretreatment process, a process of etching a portion of the second portion 140a-2 of the second-first outer layer circuit pattern 140a is essentially performed. At this time, in the case where the height of the second portion 140a-2 is 9 μm as described above, it was confirmed that there was no deformation of the second portion 140a-2 even after the pretreatment process was performed. Alternatively, when the height of the second portion 140a-2 is 10 μm or 12 μm greater than 9 μm, it was confirmed that the second portion 140a-2 was severely deformed in the pretreatment process of the surface treatment process.

FIG. 6 is a plan view illustrating a circuit board including a protective layer according to an embodiment.

Referring to FIG. 6, the protective layer 160 in the embodiment may be a protective layer that protects the surface of the second-second outer layer circuit pattern 140b in the second region R2, and it may be a support layer supporting the second-first outer layer circuit pattern 140a in the first region R1.

In this case, in the comparative example, an outermost circuit pattern having a structure protruding on the outermost insulating layer is disposed. At this time, the outermost circuit pattern is not supported by other structures. For example, the side surface of the outermost circuit pattern in the comparative example does not contact the protective layer. Accordingly, in the region corresponding to the fine pattern in the comparative example, collapse or abrasion of the circuit pattern occurs.

This may occur in the outermost circuit pattern in the circuit board including the circuit pattern manufactured by the SAP method.

Alternatively, in the embodiment, the primer layer 150 is disposed on the eighth insulating layer 118, and the second outer layer circuit pattern 140 is disposed on the primer layer 150.

In addition, the protective layer 160 serving as a support layer and a protective layer disposed around the second outer layer circuit pattern 140 is disposed on the primer layer 150.

In this case, the protective layer 160 may include a first region R1 and a second region R2. The protective layer 160 may support the second-first outer layer circuit pattern 140a disposed on the outermost layer of the circuit board 100, and in particular, the trace 141 and the pad 142 of the second outer layer circuit pattern 140a disposed in the first region R1 may be supported, and accordingly, the second-first outer layer circuit pattern 140a may be protected from external impact.

Meanwhile, in the embodiment, the protective layer 160 may have different surface roughness for each region.

The protective layer 160 may include a first upper surface 161 of the first region R1, a second upper surface 162 of the second region R2, and a boundary side surface 163 between the first upper surface 161 and the second upper surface 162.

The first upper surface 161, the second upper surface 162, and the boundary side surface 163 may each have different surface roughness.

The protective layer 160 according to the embodiment includes a first upper surface 161, a second upper surface 162, and a boundary side surface 163.

The surface roughness Ra of the first upper surface 161, the surface roughness Ra of the second upper surface 162, and the surface roughness Ra of the boundary side surface 163 may be different from each other.

The first upper surface 161 is a surface thinned by a developer after exposure and development processes are performed. The second upper surface 162 is a surface hardened by exposure. In addition, the boundary side surface 163 is a surface that has been swollen and removed by the developer.

Accordingly, the surface roughness Ra of the first upper surface 161 may be 1.0 μm or more.

Also, the surface roughness Ra of the second upper surface 162 may be in a range of 0.01 μm to 0.1 μm.

In addition, the surface roughness Ra of the boundary side surface 163 may be in a range of 0.1 to 0.5 μm.

FIG. 7 is a view illustrating an outer layer circuit pattern according to a comparative example.

Meanwhile, in forming the protective layer, various methods may be used to remove a part of the protective layer in the first region R1. For example, a part of the protective layer may be removed by a physical method or a chemical method. For example, the protective layer may be removed by a method such as plasma or sand blasting.

As shown in FIG. 7, when the protective layer is physically or chemically removed, the circuit pattern is also removed in the process of removing the protective layer, so that the circuit pattern is deformed. For example, the circuit pattern may have a triangular cross-section as a part of the circuit pattern is removed together in the process of removing the protective layer. When the cross-section of the circuit pattern has a triangular shape, an adhesive member such as a solder ball cannot be stably disposed on the circuit pattern, and thus a reliability problem may occur. In addition, in order to remove the protective layer by the physical or chemical method, expensive equipment is required, and thus manufacturing cost may increase.

Hereinafter, a method of manufacturing a circuit board according to an embodiment will be described.

FIGS. 8 to 18 are views illustrating the manufacturing method of the circuit board shown in FIG. 3 in order of process.

Referring to FIG. 8, the embodiment may preferentially proceed with a process of manufacturing the inner layer substrate 100-1 for manufacturing the inner portion of the circuit board 100.

A process for manufacturing the inner layer substrate 100-1 will be briefly described.

The inner layer substrate 100-1 may include one insulating layer or, alternatively, may include a plurality of insulating layers.

In FIG. 8, the inner substrate 100-1 is illustrated as having a seven-layered insulating layer structure, but is not limited thereto. For example, the inner layer substrate 100-1 may include fewer than seven insulating layers, or alternatively, more than seven insulating layers.

The inner layer substrate 100-1 may include the remaining insulating layers except for an insulating layer disposed on an outermost layer of the circuit board 100. For example, the inner layer substrate 100-1 may include the remaining insulating layers excluding an insulating layer disposed on the uppermost side of the circuit board 100 and other insulating layers and an insulating layer disposed on the lowermost side of the circuit board 100.

Briefly describing the process of manufacturing the inner layer substrate 100-1, the first insulating layer 111 is firstly prepared.

Then, when the first insulating layer 111 is prepared, a first via V1 is formed in the first insulating layer 111, and a first circuit pattern 121 and a second circuit pattern 122 are respectively formed on the upper and lower surfaces of the first insulating layer 111 with the first via V1.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on the upper surface of the second insulating layer 112. In addition, a third via V3 is formed in the third insulating layer 113, and a fourth circuit pattern 124 is formed under the lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on the upper surface of the fourth insulating layer 114. In addition, a fifth via V5 is formed in the fifth insulating layer 115, and a sixth circuit pattern 126 is formed under the lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on the upper surface of the sixth insulating layer 116. In addition, a seventh via V7 is formed in the seventh insulating layer 117, and an eighth circuit pattern 128 is formed under the lower surface of the seventh insulating layer 117.

Since the process of manufacturing the inner layer substrate 100-1 is a known technique in the art to which the present invention pertains, a detailed description thereof will be omitted.

Referring to FIG. 9, when the inner layer substrate 100-1 is manufactured, an eighth insulating layer 118 corresponding to the first outermost insulating layer is formed on the upper surface of the inner layer substrate 100-1. In addition, a ninth insulating layer 119 corresponding to the second outermost insulating layer is formed under the lower surface of the inner layer substrate 100-1.

At this time, when the eighth insulating layer 118 and the ninth insulating layer 119 are stacked, a primer layer 150 is disposed on the upper surface of the eighth insulating layer 118 and the lower surface of the ninth insulating layer 119, respectively, and a metal layer 155 may be disposed on the primer layer 150. The metal layer 155 may perform a planarization function so that the eighth insulating layer 118 and the ninth insulating layer 119 are stacked with a uniform height. For example, the metal layer 155 may be disposed to improve the stacking reliability of the eighth insulating layer 118 and the ninth insulating layer 119.

The primer layer 150 may serve to increase bonding strength between each of the eighth insulating layer 118 and the ninth insulating layer 119 and the first outer circuit pattern 130 and the second outer circuit pattern 140 to be disposed on the upper and lower portions thereof. That is, when the first outer layer circuit pattern 130 and the second outer layer circuit pattern 140 are disposed without the primer layer 150, since the bonding force between the eighth insulating layer 118 and the second outer layer circuit pattern 140 is low, they may be separated from each other.

Meanwhile, although FIG. 9 illustrates that the primer layer 150 is disposed on the upper surface of the eighth insulating layer 118 and the lower surface of the ninth insulating layer 119, respectively, the present invention is not limited thereto. For example, the primer layer 150 may be selectively disposed on the surface of the insulating layer on which the fine circuit pattern is to be disposed. That is, when only the first outer layer circuit pattern 130 is a fine circuit pattern, the primer layer 150 may be disposed only on the lower surface of the ninth insulating layer 119. In addition, when only the second outer layer circuit pattern 140 is a fine circuit pattern, the primer layer 150 may be disposed only on the upper surface of the eighth insulating layer 118. In addition, when the first outer circuit pattern 130 and the second outer circuit pattern 140 are both fine circuit patterns, the primer layer 150 may be disposed on both the upper surface of the eighth insulating layer 118 and the lower surface of the ninth insulating layer 119.

Referring to FIG. 10, when the eighth insulating layer 118 and the ninth insulating layer 119 are disposed, a via hole VH may be formed in each of the eighth insulating layer 118 and the ninth insulating layer 119. In this case, the via hole VH may be formed not only in the eighth insulating layer 118 and the ninth insulating layer 119, but also in each of the primer layer 150 and the metal layer 155.

Next, referring to FIG. 11, when the via hole VH is formed, an etching process for removing the metal layer 155 disposed on the primer layer 150 may be performed. For example, after the via hole VH is formed, a flash etching process may be performed to remove the metal layer 155, and thus a process for exposing the surface of the primer layer 150 may be performed.

Next, referring to FIG. 12, a via (V) forming process for filling the via hole (VH) may be performed. Accordingly, the second outer layer circuit pattern 140 is formed on the upper surface of the eighth insulating layer 118, and the first outer layer circuit pattern 130 may be formed on the lower surface of the ninth insulating layer 119. In this case, in the embodiment, the first outer layer circuit pattern 130 is illustrated as a general circuit pattern rather than a fine circuit pattern. However, the present invention is not limited thereto, and the first outer layer circuit pattern 130 together with the second outer layer circuit pattern may be a fine circuit pattern. Accordingly, when the first outer circuit pattern 130 is a general circuit pattern, the primer layer 150 between the ninth insulating layer 119 and the first outer circuit pattern 130 may be omitted.

Next, referring to FIG. 13, a first pretreatment process may be performed on the second outer layer circuit pattern 140 disposed on the upper surface of the eighth insulating layer 118. The first pretreatment may refer to a pretreatment process before forming the protective layer 160. For example, the first pretreatment may be a process of imparting roughness to the second outer layer circuit pattern 140 disposed on the upper surface of the eighth insulating layer 118. Accordingly, after the first pretreatment process, roughness may be provided to the surface of the second outer layer circuit pattern 140.

In this case, the surface of the second outer layer circuit pattern 140 after the first pretreatment process may have the same surface roughness Ra regardless of the region thereof.

For example, the surface roughness Ra of the second-first outer layer circuit pattern 140a and the surface roughness Ra of the second-second outer layer circuit pattern 140b after the first pretreatment process may be the same as each other.

For example, the surface roughness Ra of the second outer layer circuit pattern 140 may be in a range of 510 nm to 580 nm.

Next, referring to FIG. 14, a solder resist layer is disposed on the primer layer 150 to cover the second outer layer circuit pattern 140. In this case, the formed solder resist layer may be disposed on both the first region R1 and the second region R2, and may have a height greater than that of the second outer layer circuit pattern 140.

After the solder resist layer is formed, the protection layer 160 having a different height for each region may be formed by exposing and developing the solder resist layer. Preferably, in an embodiment, the process of exposing the second region R2 of the solder resist layer to light and thus developing the first region R1 of the solder resist layer may be performed.

For this, UV exposure is performed by masking only the desired region on the solder resist layer, afterwards, in the unexposed region, it can be dipping in an organic alkaline compound containing tetramethylammonium hydroxide (TMAH) or trimethyl-2-hydroxyethylammonium hydroxide (choline), and accordingly, a process of adjusting the height of the protective layer may be performed to form the protective layer 160.

And, referring to FIG. 15, as the above process is performed, the protective layer 160 may have a height lower than that of the second outer layer circuit pattern 140 in the first region R1. For example, the protective layer 160 may not contact the upper surface of the second-first outer layer circuit pattern 140a disposed in the first region R1. In addition, the protective layer 160 may be formed to cover the second-second outer layer circuit pattern 140b in the second region R2.

On the other hand, referring to FIG. 16, in the process of forming the first region R1 and the second region R2 of the protective layer 160, the surface of the second portion 140a-2 of the second-first outer layer circuit pattern 140a may not come into contact with the protective layer 160. For example, in the first region R1 of the protective layer 160, the second-first outer layer circuit pattern 140a may be included a first portion 140a-1 covered with the protective layer 160 and a second portion 140a-2 that is not in contact with the protective layer 160 through an open region of the protective layer 160.

In this case, the first portion 140a-1 and the second portion 140a-2 of the second-first outer layer circuit pattern 140a may have the same surface roughness Ra. For example, the first portion 140a-1 and the second portion 140a-2 of the second-first outer layer circuit pattern 140a may each have a surface roughness Ra in a range of 510 nm to 580 nm.

Next, referring to FIG. 17, in the embodiment, a second pretreatment process may be performed. The second pretreatment process may refer to a pretreatment process of the surface treatment process. For example, the second pretreatment process may refer to a pretreatment process performed before the OSP process or the ENEPIG process.

In this case, the second portion 140a-2 of the second-first outer layer circuit pattern 140a is etched by the second pretreatment process. In this case, the etching degree of the second portion 140a-2 may be determined according to the conditions of the second pretreatment process. In this case, depending on the degree of etching, a problem may occur in the reliability of the second portion 140a-2. For example, when the etching degree is too small, the reliability of the surface treatment process may decrease, and when the etching degree is too large, deformation may occur in the second portion 140a-2, thereby causing reliability problems. Accordingly, in the embodiment, an etching condition in the second pretreatment process is determined to maintain an optimal condition of the second portion 140a-2.

In an embodiment, the etching condition of the second pretreatment process may be an etching rate corresponding to the etching degree of the second portion 140a-2. In addition, the degree of change in the surface roughness Ra of the second portion 140a-2 may be determined according to the etching rate. For example, a difference value between the surface roughness Ra of the second portion 140a-2 and the surface roughness Ra of the first portion 140a-2 may be determined according to the etching rate.

The etching rate of the second pretreatment process in the embodiment may be 0.3 µm. And, when the etching rate is 0.3 µm, the surface roughness Ra of the second portion 140a-2 may be maintained at a level of 80% to 90%, and furthermore, 85% to 88% of the surface roughness Ra of the first portion 140a-1.

Referring to FIG. 18A, when the etching rate is 0.3 µm, the surface roughness Ra of the second portion 140a-2 is reduced to a level of 79% or less compared to the surface roughness Ra of the first portion 140a-1.

On the other hand, when the etching rate is greater than 0.3 μm, the surface roughness Ra of the second portion 140a-2 is lower than that of the embodiment, and thus a reliability problem occurs.

For example, when the etching rate is 0.5 μm as in (b) of FIG. 18, the surface roughness Ra of the second portion 140a-2 reduced to a level of 79% or less compared to the surface roughness Ra of the first portion 140a-1.

In addition, as in FIG. 18 (c), when the etching rate is 0.9 μm, the surface roughness Ra of the second portion 140a-2 is reduced to a level of 60% or less compared to the surface roughness Ra of the first portion 140a-1. In addition, in this case, damage is applied to the second portion 140a-2, and accordingly, there is a problem in that the second portion 140a-2 is deformed.

Meanwhile, in the embodiment, a package substrate may be manufactured using the above-described circuit board.

For example, an adhesive portion (not shown) may be disposed on the pad 142 of the second outer layer circuit pattern 140 of the circuit board. In addition, a chip may be disposed on the adhesive portion.

For example, a plurality of the pads 142 may be formed to be spaced apart in the width direction, and a plurality of the chips may be mounted on the plurality of pads.

For example, any one of a central processor (e.g., CPU), a graphic processor (e.g., GPU), a digital signal processor, an encryption processor, a microprocessor, and a microcontroller may be mounted on the pad 142.

For example, at least two different chips among a central processor (e.g., CPU), a graphic processor (e.g., GPU), a digital signal processor, an encryption processor, a microprocessor, and a microcontroller may be mounted on the pad.

The at least two chips may be spaced apart from each other in a horizontal direction on the circuit board, but is not limited thereto. For example, the at least two chips may be vertically spaced apart from each other on the circuit board according to product design.

The circuit board in this embodiment includes an outer layer circuit pattern disposed on an outermost side. In this case, the outer layer circuit pattern includes a second-first outer layer circuit pattern disposed in a first region of a protective layer and a second-second outer layer circuit pattern disposed on a second region of the protective layer. In this case, the second-second outer layer circuit pattern may be supported by the protective layer, since the second-first outer layer circuit pattern does not have a support layer capable of supporting it, it has a problem that it can easily collapse due to various factors.

Accordingly, in the embodiment, the second-first outer layer circuit pattern can be supported by using the protective layer. Therefore, in the embodiment, it is possible to solve problems such as collapsing or rubbing of the protruding outer layer circuit pattern by miniaturization of the outer layer circuit pattern, and accordingly, product reliability may be improved. In particular, in the embodiment, it is possible to solve problems such as collapsing or rubbing of the outer layer circuit pattern in the first region, and accordingly, product reliability may be improved.

In addition, in the embodiment, in forming the first region of the protective layer, it is removed using an exposure and development method instead of a sand blast method or a plasma method. At this time, when the protective layer is removed by sandblasting or plasma method, deformation of the circuit pattern of the outer layer may occur, and in some cases, the cross-section of the outer layer circuit pattern may have a triangular shape. And, when the cross-section of the outer layer circuit pattern has a triangular shape, an adhesive member cannot be stably disposed on the outer layer circuit pattern, and accordingly, a reliability problem may occur. In contrast, in the embodiment, the protective layer can be processed without deformation of the outer layer circuit pattern, and accordingly, reliability may be improved.

In addition, the second-first outer layer circuit pattern in the embodiment includes a first portion in contact with the protective layer and a second portion other than the first portion not in contact with the protective layer. Through this, in the embodiment, it is possible to minimize the degree of etching of the second portion occurring in the pretreatment process of the surface treatment. Accordingly, in the embodiment, the surface roughness Ra of the first portion of the second-first outer layer circuit pattern may be in a range of 510 nm to 580 nm. In addition, the surface roughness Ra of the second portion of the second-first outer layer circuit pattern may have a range of 440 nm to 510 nm, which is 80% to 90% of the surface roughness Ra of the first portion. Accordingly, in the embodiment, it is possible to minimize deformation of the second portion of the second-first outer layer circuit pattern, and accordingly, the reliability of the surface treatment process may be improved.

In addition, in the embodiment, the height of the second portion of the second-first outer layer circuit pattern (e.g., the difference between the height of the first region of the protective layer and the height of the second-first outer layer circuit pattern) should have a value between 3 μm and 9 μm. Accordingly, in the embodiment, it is possible to solve the reliability problem due to a portion of the upper surface of the second-first outer layer circuit pattern being covered with the protective layer. Furthermore, in the embodiment, it is possible to solve problems such as pattern deformation or pattern collapse that may occur as the height of the second portion of the second-first outer layer circuit pattern increases.

In addition, the circuit board in the embodiment is applicable to the 5G communication system. For example, the circuit board in the embodiment may be used to transmit a high-frequency signal. Furthermore, in the embodiment, it is possible to minimize transmission loss that may occur in the transmission of a high-frequency signal.

The characteristics, structures, effects, and the like described in the above-described embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, the above description has been focused on the embodiments, but it is merely illustrative and does not limit the present invention. It will be apparent to those skilled in the art that various modifications and applications not illustrated above are possible without departing from the essential features of the present embodiment. For example, elements of the embodiments described herein may be modified and realized. Also, it should be construed that differences related to such changes and applications are included in the scope of the present invention defined in the appended claims.

What is claimed is:

1. A circuit board comprising:
a build-up insulating structure including a plurality of insulating layers laminated along a vertical direction;
a protective layer disposed on the build-up insulating structure and including a first region having a first thickness and a second region having a second thickness greater than the first thickness; and
a circuit pattern part including a first circuit pattern passing through the first region and a second circuit pattern embedded in the second region,
wherein the first circuit pattern includes an upper surface and a side surface,
wherein the side surface includes a first portion in contact with the protective layer; and a second portion provided on the first portion and not in contact with the protective layer, and
wherein a surface roughness of the second portion of the side surface and the upper surface of the first circuit pattern satisfies 80% to 90% of a surface roughness of the first portion of the side surface.

2. The circuit board of claim 1, wherein the second portion is spaced apart from the second region of the protective layer in a horizontal direction.

3. The circuit board of claim 1, wherein the second portion of the side surface of the first circuit pattern does not overlap with the first region of the protective layer in a horizontal direction.

4. The circuit board of claim 2, wherein the second portion of the side surface of the first circuit pattern overlaps the second region of the protective layer in a horizontal direction.

5. The circuit board of claim 2, wherein the first circuit pattern includes a pad and a trace spaced apart in a horizontal direction, and
wherein each of the pad and the trace includes the first and second portions.

6. The circuit board of claim 2, wherein the first thickness of the protective layer satisfies a range of 70% to 90% of a thickness of the first circuit pattern.

7. The circuit board of claim 2, wherein a length of the second portion of the side surface of the first circuit pattern in a vertical direction satisfies a range of 3 μm to 9 μm.

8. The circuit board of claim 2, wherein the second circuit pattern having upper and side surfaces entirely covered with the second region of the protective layer.

9. The circuit board of claim 2, wherein a surface roughness of an upper surface of the first region of the protective layer is different from a surface roughness of an upper surface of the second region.

10. The circuit board of claim 8, wherein a surface roughness of the side surface of the second circuit pattern is the same as the surface roughness of the first portion of the side surface of the first circuit pattern.

11. The circuit board of claim 10, wherein the surface roughness of the side surface of the second circuit pattern is greater than the surface roughness of the second portion of the side surface of the first circuit pattern, and
wherein the surface roughness of the second portion of the side surface and the upper surface of the first circuit pattern satisfies 80% to 90% of the surface roughness of the second circuit pattern.

12. The circuit board of claim 11, wherein the surface roughness (Ra) of the first portion of the side surface of the first circuit pattern and the side surface of the second circuit pattern satisfies a range of 510 nm to 580 nm, and
wherein the surface roughness (Ra) of the second portion of the side surface and the upper surface of the first circuit pattern satisfies a range of 440 nm to 510 nm.

13. The circuit board of claim 9, wherein the protective layer has an inner surface connecting the upper surface of the first region and the upper surface of the second region, and
wherein a surface roughness of the inner surface is different from the surface roughness of the upper surface of the first region and the surface roughness of the upper surface of the second region.

* * * * *